(12) United States Patent
Huang et al.

(10) Patent No.: US 12,720,959 B2
(45) Date of Patent: Aug. 25, 2026

(54) DISPLAY SUBSTRATE AND PREPARATION METHOD THEREFOR, AND DISPLAY APPARATUS

(71) Applicant: BOE Technology Group Co., Ltd., Beijing (CN)

(72) Inventors: Haitao Huang, Beijing (CN); Chuanxiang Xu, Beijing (CN); Yong Yu, Beijing (CN); Huili Wu, Beijing (CN); Zhao Cui, Beijing (CN); Wenqu Liu, Beijing (CN); Shi Shu, Beijing (CN); Lina Jing, Beijing (CN); Detian Meng, Beijing (CN); Zibo Ni, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 951 days.

(21) Appl. No.: 17/916,047

(22) PCT Filed: Oct. 26, 2021

(86) PCT No.: PCT/CN2021/126477

§ 371 (c)(1),
(2) Date: May 4, 2023

(87) PCT Pub. No.: WO2023/070328

PCT Pub. Date: May 4, 2023

(65) Prior Publication Data

US 2024/0215335 A1 Jun. 27, 2024

(51) Int. Cl.
*H10K 59/122* (2023.01)
*H10K 59/12* (2023.01)
(Continued)

(52) U.S. Cl.
CPC ....... *H10K 59/122* (2023.02); *H10K 59/1201* (2023.02); *H10K 59/124* (2023.02);
(Continued)

(58) Field of Classification Search
None
See application file for complete search history.

(56) References Cited

U.S. PATENT DOCUMENTS

2015/0069361 A1 3/2015 Sato et al.
2015/0380466 A1 12/2015 Koo et al.
(Continued)

FOREIGN PATENT DOCUMENTS

CN 109524422 A 3/2019
CN 109728197 A * 5/2019 ........... H10K 59/353
(Continued)

OTHER PUBLICATIONS

European Search Report for 21961704.0 Mailed May 28, 2024.
(Continued)

*Primary Examiner* — Sue A Purvis
*Assistant Examiner* — Seyon Ali-Simah Punchbeddell

(57) ABSTRACT

A display substrate and a preparation method thereof, and a display apparatus. The display substrate includes a base substrate, at least one insulating film layer disposed on the base substrate, and a first electrode disposed on a side of the at least one insulating film layer away from the base substrate; wherein a concave-convex structure is disposed on a side of the at least one insulating film layer away from the base substrate, and there is an overlapping area between an orthographic projection of the concave-convex structure on the base substrate and an orthographic projection of the first electrode on the base substrate.

17 Claims, 13 Drawing Sheets

(51) Int. Cl.

| | |
|---|---|
| ***H10K 59/124*** | (2023.01) |
| ***H10K 59/38*** | (2023.01) |
| ***H10K 59/80*** | (2023.01) |
| ***H10K 71/60*** | (2023.01) |

(52) U.S. Cl.

CPC ........... *H10K 59/38* (2023.02); *H10K 59/873* (2023.02); *H10K 59/8792* (2023.02); *H10K 71/60* (2023.02)

(56) References Cited

U.S. PATENT DOCUMENTS

| | | | | |
|---|---|---|---|---|
| 2016/0380037 | A1 | 12/2016 | Kajiyama | |
| 2017/0125738 | A1* | 5/2017 | Kim | H10K 59/877 |
| 2018/0006273 | A1* | 1/2018 | Kim | H10K 59/80515 |
| 2020/0119113 | A1* | 4/2020 | Lee | H10K 50/11 |
| 2020/0219906 | A1 | 7/2020 | Zheng et al. | |
| 2021/0217827 | A1* | 7/2021 | Tang | H10K 59/38 |
| 2022/0415981 | A1* | 12/2022 | Shu | H10K 59/80521 |

FOREIGN PATENT DOCUMENTS

| | | | | |
|---|---|---|---|---|
| CN | 111326636 | A * | 6/2020 | H10K 59/8792 |
| JP | 2016027374 | A | 2/2016 | |

OTHER PUBLICATIONS

Office Action dated Jul. 8, 2025 for JP2023-575612 and English Translation.

Office Action dated Oct. 30, 2025 for U.S. Appl. No. 18/360,851.

* cited by examiner

DISPLAY SUBSTRATE AND PREPARATION METHOD THEREFOR, AND DISPLAY APPARATUS

CROSS-REFERENCE TO RELATED APPLICATION

The present application is a U.S. National Phase Entry of International Application PCT/CN2021/126477 having an international filing date of Oct. 26, 2021, and the contents disclosed in the above-mentioned application are hereby incorporated as a part of this application.

TECHNICAL FIELD

Embodiments of the present disclosure relate to, but are not limited to, the field of display technologies, in particular to a display substrate and a method for preparing the display substrate, and a display apparatus.

BACKGROUND

An Organic Light Emitting Diode (OLED) is an active light emitting display device, which has the advantages of luminescence, ultra-thinness, wide angle of view, high brightness, high contrast, low power consumption, extremely high response speed, etc. Depending upon driving modes, OLEDs may be divided into two types, i.e., a passive matrix (PM) type and an active matrix (AM) type. An AMOLED is a current driven device in which an independent thin film transistor (TFT) is used for controlling each sub-pixel, and each sub-pixel may be continuously and independently driven to emit light.

SUMMARY

The following is a summary of subject matter described herein in detail. The summary is not intended to limit the protection scope of claims.

An embodiment of the present disclosure provides a display substrate, including: a base substrate, at least one insulating film layer disposed on the base substrate, and first electrodes disposed on a side of the at least one insulating film layer away from the base substrate; wherein a concave-convex structure is disposed on a side of the at least one insulating film layer away from the base substrate, and there is an overlapping area between an orthographic projection of the concave-convex structure on the base substrate and an orthographic projection of the first electrodes on the base substrate.

In an exemplary embodiment, the display substrate includes: a planarization layer, a light emitting structure layer, an encapsulation layer and a color filter layer that are sequentially formed on the base substrate, wherein the light emitting structure layer includes a pixel definition layer, an anode, a cathode and an organic light emitting layer between the anode and the cathode, the pixel definition layer includes multiple pixel openings which expose at least part of the anode; the cathode covers the pixel definition layer;

the color filter layer includes a black matrix and a color filter disposed at intervals, the black matrix has multiple opening areas arranged in a matrix, the color filter is at least partially filled in an opening area, the color filter and the black matrix at least include a partially overlapping area where the color filter covers the black matrix.

In an exemplary embodiment, the at least one insulating film layer includes the pixel definition layer, and the first electrodes include the cathode.

In an exemplary embodiment, the pixel definition layer includes multiple first convex portions, and a first concave portion is formed between adjacent first convex portions.

In an exemplary embodiment, the first concave portion is a groove surrounding a pixel opening, and a distance between adjacent grooves is between ⅛ and ⅞ of a distance between an edge of the opening area of the black matrix and an edge of the pixel opening formed in the pixel definition layer.

In an exemplary embodiment, the distance between adjacent grooves is between 1 micron and 2 microns.

In an exemplary embodiment, a width of the groove is between 0.8 microns and 1.5 microns.

In an exemplary embodiment, the first concave portion is an aperture surrounding a pixel opening, and a width of the aperture is between 0.5 microns and 1.8 microns.

In an exemplary embodiment, multiple apertures form multiple annular structure units, at least one annular structure unit includes N annular structures disposed around the pixel opening and parallel to each other, and an innermost annular structure includes multiple first apertures, the first apertures are adjacent to the pixel opening, and N is a natural number greater than 1.

In an exemplary embodiment, serrated protrusions are formed between the multiple first apertures, and a width of a serrated protrusion is between 0.8 microns and 1.5 microns.

In an exemplary embodiment, N is a natural number between 1 and 50.

In an exemplary embodiment, the at least one insulating film layer includes the planarization layer, and the first electrodes include the anode.

In an exemplary embodiment, the planarization layer includes multiple second convex portions, and second concave portions are formed between adjacent second convex portions.

In an exemplary embodiment, the second convex portion is serrated.

In an exemplary embodiment, a segment difference between a second convex portion and a second concave portion is between ⅛ and ⅞ of a thickness of the planarization layer.

In an exemplary embodiment, the segment difference between the second convex portion and the second concave portion is between 0.2 microns and 0.8 microns.

In an exemplary embodiment, the at least one insulating film layer includes the pixel definition layer and the planarization layer, and the first electrodes include the cathode and the anode; a first concave-convex structure is disposed on a side of the pixel definition layer away from the base substrate, and there is an overlapping area between an orthographic projection of the first concave-convex structure on the base substrate and an orthographic projection of the cathode on the base substrate; and a second concave-convex structure is disposed on a side of the planarization layer away from the base substrate, and there is an overlapping area between an orthographic projection of the second concave-convex structure on the base substrate and an orthographic projection of the anode on the base substrate.

In an exemplary embodiment, the display substrate further includes a touch structure layer disposed between the encapsulation layer and the color filter layer, the touch structure layer includes multiple touch electrodes, and an orthographic projection of the black matrix on the base substrate includes an orthographic projection of the touch electrodes on the base substrate.

An embodiment of the present disclosure further provides a display apparatus, including any one of the above display substrates.

An embodiment of the present disclosure provides a method for preparing a display substrate, including: forming at least one insulating film layer on a base substrate, and providing a concave-convex structure on a side of the at least one insulating film layer away from the base substrate; and forming the first electrode on a side of the at least one insulating film layer away from the base substrate, with an overlapping area between an orthographic projection of the concave-convex structure on the base substrate and an orthographic projection of the first electrode on the base substrate.

Other aspects may be understood upon reading and understanding the drawings and the detailed description.

BRIEF DESCRIPTION OF DRAWINGS

The drawings are intended to provide a further understanding of technical solutions of the present disclosure and form a part of the specification, and are used to explain the technical solutions of the present disclosure together with embodiments of the present disclosure, and not intended to form limitations on the technical solutions of the present disclosure. Shapes and sizes of various components in the drawings do not reflect actual scales, and are only intended to schematically illustrate contents of the present disclosure.

DETAILED DESCRIPTION

Figure 1:
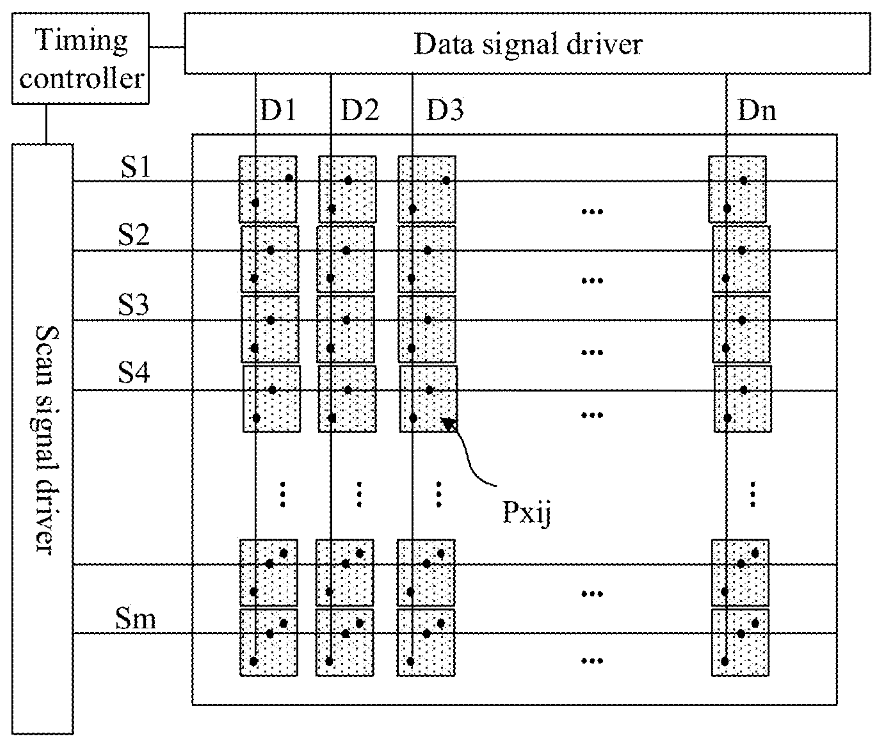
FIG. 1 is a schematic diagram of a structure of a display apparatus.

To make objectives, technical solutions, and advantages of the present disclosure clearer, the embodiments of the present disclosure will be described in detail with reference to the accompanying drawings. Implementations may be carried out in multiple different forms. Those of ordinary skills in the art may easily understand such a fact that implementations and contents may be transformed into various forms without departing from the purpose and scope of the present disclosure. Therefore, the present disclosure should not be explained as being limited to contents described in following implementations only. The embodiments in the present disclosure and features in the embodiments may be combined randomly with each other if there is no conflict.

Scales of the drawings in the present disclosure may be used as a reference in the actual process, but are not used as limitations. For example, a width-length ratio of a channel, thickness and spacing of each film layer, and width and spacing of each signal line may be adjusted according to actual needs. The number of pixels in the display substrate and the number of sub-pixels in each pixel are not limited to the number shown in the drawings. The drawings described in the present disclosure are schematic structural diagrams only, and one implementation mode of the present disclosure is not limited to the shapes, numerical values or the like shown in the drawings.

Ordinal numerals such as “first”, “second”, and “third” in the specification are set to avoid confusion between constituent elements, but not to set a limit in quantity.

In the specification, for convenience, wordings indicating directional or positional relationships, such as “middle”, “upper”, “lower”, “front”, “back”, “vertical”, “horizontal”, “top”, “bottom”, “inside”, and “outside”, are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements may be changed as appropriate according to directions for describing the constituent elements.

Therefore, appropriate replacements may be made according to situations without being limited to the wordings in the specification.

In the specification, unless otherwise specified and defined explicitly, terms "mount", "mutually connect", and "connect" should be understood in a broad sense, which, for example, may be a fixed connection, or a detachable connection, or an integrated connection; may be a mechanical connection or an electrical connection; and may be a direct mutual connection, or an indirect connection through middleware, or internal communication between two elements. Those of ordinary skills in the art may understand specific meanings of these terms in the present disclosure according to specific situations.

In the specification, a transistor refers to an element which at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source electrode. It is to be noted that, in the specification, the channel region refers to a region through which the current mainly flows.

In the specification, a first electrode may be a drain electrode and a second electrode may be a source electrode; or, the first electrode may be a source electrode and the second electrode may be a drain electrode. In cases that transistors with opposite polarities are used, a current direction changes during operation of a circuit, or the like, functions of the "source electrode" and the "drain electrode" are sometimes interchanged. Therefore, the "source electrode" and the "drain electrode", as well as the "source terminal" and the "drain terminal" are interchangeable in the specification.

In the specification, "electrical connection" includes a case that constituent elements are connected together through an element with a certain electrical effect. The "element with a certain electrical effect" is not particularly limited as long as electrical signals may be sent and received between the connected constituent elements. Examples of the "element with a certain electrical effect" not only include electrodes and wirings, but also include switch elements such as transistors, resistors, inductors, capacitors, other elements with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulating film" may be replaced with an "insulating layer" sometimes.

Triangle, rectangle, trapezoid, pentagon or hexagon, etc. in this specification is not strictly defined, which may be approximate triangle, rectangle, trapezoid, pentagon or hexagon, etc. There may be some small deformation caused by tolerance, and there may be guide angle, arc edge and deformation, etc.

In the present disclosure, "about" refers to that a boundary is defined not so strictly and numerical values within process and measurement error ranges are allowed.

FIG. 1 is a schematic diagram of a structure of a display apparatus. As shown in FIG. 1, the display apparatus may include a timing controller, a data signal driver, a scan signal driver, and a pixel array. The timing controller is connected to the data signal driver and the scan signal driver respectively, the data signal driver is connected to multiple data signal lines (D1 to Dn) respectively, and the scan signal driver is connected to multiple scan signal lines (S1 to Sm) respectively. The pixel array may include multiple sub-pixels Pxij, wherein i and j may be natural numbers. At least one sub-pixel Pxij may include a circuit unit and a light emitting device connected to the circuit unit, wherein the circuit unit may include at least one scan signal line, at least one data signal line and a pixel drive circuit. In some exemplary embodiments, the timing controller may provide the data signal driver with a control signal and a gray scale value which are suitable for the specification of the data signal driver, and may provide the scan signal driver with a scan start signal, a clock signal which are suitable for the specification of the scan signal driver and the like. The data signal driver may generate a data voltage to be provided to the data signal lines D1, D2, D3, . . . , and Dn by using the gray scale value and the control signal that are received from the timing controller. For example, the data signal driver may sample the gray scale value using a clock signal and apply a data voltage corresponding to the gray scale value to the data signal lines D1 to Dn by taking a pixel row as a unit, wherein n may be a natural number. The scan signal driver may receive the clock signal, the scan start signal, etc., from the timing controller to generate a scan signal to be provided to the scan signal lines S1, S2, S3, . . . , and Sm. For example, the scan signal driver may sequentially provide a scan signal with an on-level pulse to the scan signal lines S1 to Sm. For example, the scan signal driver may be constructed in a form of a shift register and generate a scan signal in a manner of sequentially transmitting a scan start signal provided in a form of an on-level pulse to a next-stage circuit under control of the clock signal, wherein m may be a natural number.

Figure 2:
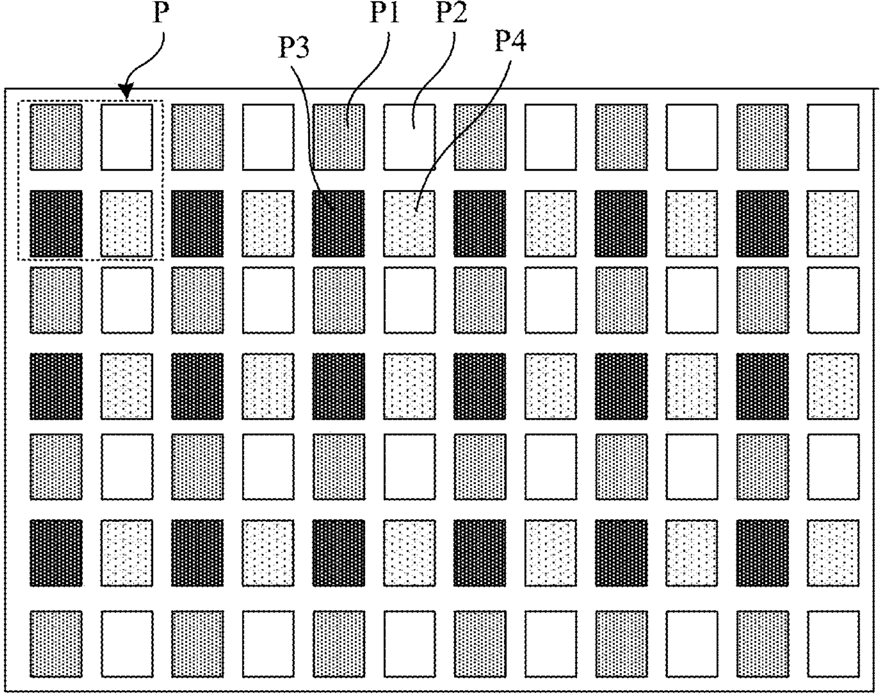
FIG. 2 is a schematic diagram of a planar structure of a display substrate.

FIG. 2 is a schematic diagram of a planar structure of a display substrate. As shown in FIG. 2, the display substrate may include multiple pixel units P arranged in a matrix. At least one of the multiple pixel units P includes a first sub-pixel P1 emitting light of a first color, a second sub-pixel P2 emitting light of a second color, and a third sub-pixel P3 emitting light of a third color light and a fourth sub-pixel P4 emitting light of a fourth color. The four sub-pixels may each include a circuit unit and a light emitting device, wherein the circuit unit may include a scan signal line, a data signal line and a pixel drive circuit. The pixel drive circuit is respectively connected to the scan signal line and the data signal line, and the pixel drive circuit is configured to receive a data voltage transmitted by the data signal line and output a corresponding current to the light emitting device, under the control of the scan signal line. The light emitting device in each sub-pixel is connected to a pixel drive circuit of a sub-pixel where the light emitting device is located, and is configured to emit light with a corresponding brightness in response to a current output by the pixel drive circuit of the sub-pixel where the light emitting device is located.

In some exemplary embodiments, the first sub-pixel P1 may be a red sub-pixel (R) emitting red light, the second sub-pixel P2 may be a green sub-pixel (G) emitting green light, the third sub-pixel P3 may be a white sub-pixel (W) emitting white light, and the fourth sub-pixel P4 may be a blue sub-pixel (B) emitting blue light.

In some exemplary embodiments, a shape of a sub-pixel may be a rectangle, a rhombus, a pentagon, or a hexagon. In an exemplary implementation, the four sub-pixels may be arranged in a horizontal side-by-side manner to form an RWBG pixel arrangement. In another exemplary implementation, the four sub-pixels may be arranged in a square, diamond, vertical side-by-side manner or the like, which is not limited here in the present disclosure.

In some other exemplary implementations, at least one of the multiple pixel units P may include a red (R) sub-pixel emitting red light, a green (G) sub-pixel emitting green light, and a blue (B) sub-pixel emitting blue light; or may include a red sub-pixel emitting red light, two green sub-pixels emitting green light and a blue sub-pixel emitting blue light, which is not limited here in the present disclosure. When the pixel unit includes three sub-pixels, the three sub-pixels may be arranged side by side horizontally, side by side vertically, or in a delta-like form; and when the pixel unit includes four sub-pixels, the four sub-pixels may be arranged side by side horizontally, side by side vertically, or in a shape of a square, which is not limited in the present disclosure.

In some exemplary embodiments, multiple sub-pixels sequentially arranged in a horizontal direction are referred to as pixel rows, and multiple sub-pixels sequentially arranged in a vertical direction are referred to as pixel columns, wherein the multiple pixel rows and the multiple pixel columns together form a pixel array arranged in an array.

Figure 3A:
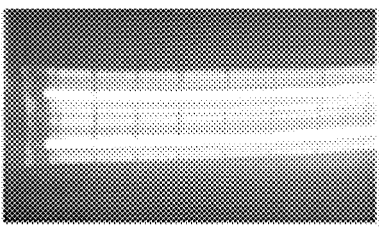
FIG. 3*a* and FIG. 3*b* are schematic diagrams of two color separation phenomena.
Figure 3B:
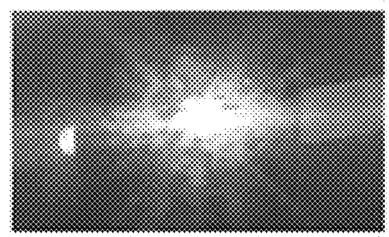

At present, compared with a Liquid Crystal Display (LCD) screen, the most remarkable feature of an OLED panel is all-solid-state display (excluding liquid crystal), which has obvious advantages in bending and even folding ability. In order to improve bending performance of OLED products, it is necessary to continuously reduce a thickness of a module. However, an anti-reflection circular polarizer and a touch module attached account for a large proportion of an overall thickness. In order to solve this problem, methods of integrating a touch structure and a color filter structure on an OLED encapsulation layer, i.e., Touch on TFE (TOT) technology and CF on Encapsulation (COE) technology, are employed, which greatly reduces the thickness of the module. However, the COE technology will lead to a dark color separation phenomenon, i.e., when the screen is off, an obvious color separation of reflected light will be seen under the illumination of a light source, which affects the user's experience of absolute black screen, as shown in FIG. 3*a* and FIG. 3*b*.

After analysis and verification, it is found that a main cause of the dark color separation phenomenon is that after removal of circular polarizers, intensity distribution of ambient light is changed to different extents through reflection of red, green and blue pixels and directional reflection of cathodes and anodes. In some technologies, scattering particles are doped in a coating protective layer (OC) to scatter light in order to improve color separation. However, introduction of scattering particles will reduce light transmittance, thus leading to a loss of the advantage of high transmittance of COE.

An embodiment of the present disclosure provides a display substrate, including: a base substrate, at least one insulating film layer disposed on the base substrate, and first electrodes disposed on a side of the insulating film layer away from the base substrate, wherein a concave-convex structure is disposed on a side of the at least one insulating film layer away from the base substrate, and there is an overlapping area between an orthographic projection of the concave-convex structure on the base substrate and an orthographic projection of the first electrodes on the base substrate.

In the display substrate according to the embodiment of the present disclosure, by processing at least one insulating film layer at a position opposite to the first electrode, a concave-convex structure is formed, which interferes with a reflection path of ambient light and deteriorates the emission of ambient light, thus improving the color separation phenomenon. Moreover, the display substrate in the present disclosure has a simple preparation process and high production efficiency, and has advantages such as low production cost and high yield, and therefore has a good application prospect.

Figure 4:
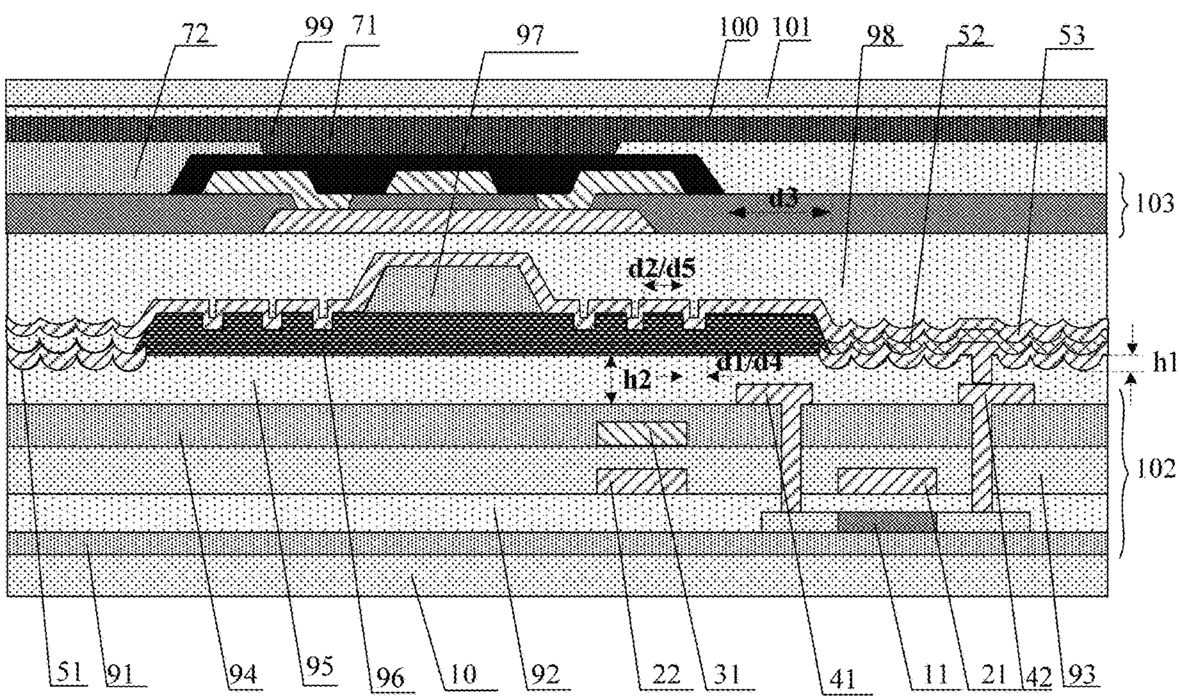
FIG. 4 is a schematic diagram of a structure of a display substrate according to an embodiment of the present disclosure.

FIG. 4 is a schematic diagram of a sectional structure of a display substrate according to an embodiment of the present disclosure. As shown in FIG. 4, the display substrate in the embodiment of the present disclosure includes: a base substrate, and a planarization layer 95 and a light emitting structure layer sequentially formed on the base substrate. The light emitting structure layer includes an anode 51. At least one insulating film layer includes a planarization layer 95, and the first electrodes include an anode 51;

a second concave-convex structure is provided on a side of the planarization layer 95 away from the base substrate, and there is an overlapping area between an orthographic projection of the second concave-convex structure on the base substrate and an orthographic projection of the anode 51 on the base substrate.

Figure 5A:
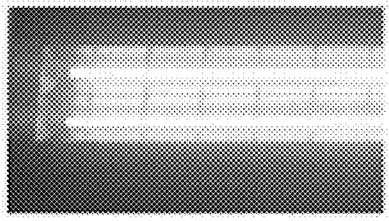
FIG. 5*a* and FIG. 5*b* are schematic diagrams of results after improvement of color separation according to the present disclosure.
Figure 5B:
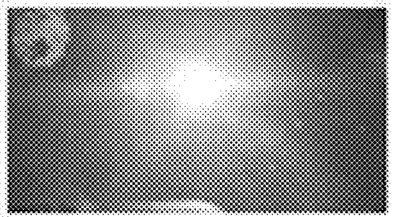

In the display substrate in this embodiment, by performing gently undulating processing on the planarization layer 95 at a position directly opposite to the anode 51, the anode 51 is formed with a certain undulating shape, i.e., a diffuse reflection anode is formed, which interferes with a reflection path of ambient light, deteriorates the emission of ambient light, and improves the color separation phenomenon. As shown in FIG. 5*a* and FIG. 5*b*, the display substrate in the embodiment of the present disclosure has greatly reduced color separation, may maintain black color well under dark strong light illumination, and is demonstrated to have obvious effect through user's experience test.

In some exemplary embodiments, the second concave-convex structure includes multiple second convex portions, and a second concave portion is formed between adjacent second convex portions.

In some exemplary embodiments, the second convex portion may be serrated.

In some exemplary embodiments, a segment difference between a second convex portion and a second concave portion may be between 0.2 microns and 0.8 microns.

In some exemplary embodiments, the light emitting structure layer further includes a pixel definition layer 96, wherein the pixel definition layer 96 includes multiple pixel openings that expose the anode 51. A first concave-convex structure is disposed on a side of the pixel definition layer 96 away from the base substrate.

In this embodiment, the at least one insulating film layer includes a pixel definition layer 96, the first electrodes includes a cathode. By performing gently undulating processing on the pixel definition layer 96 as well, the pixel definition layer 96 is formed with an undulating shape, so that at the time of depositing the cathode, the cathode may also be formed with an undulating shape, i.e., a scattering cathode surface is formed, which interferes with the reflection path of ambient light, deteriorates the emission of ambient light, and further improves the color separation phenomenon.

In some exemplary embodiments, the first concave-convex structure includes multiple first convex portions, and a first concave portion is formed between adjacent first convex portions.

In some exemplary embodiments, the first concave portion is a groove surrounding a pixel opening, a width of the groove is between 0.8 microns and 1.5 microns, and a distance between adjacent grooves is between 1 micron and 2 microns.

In some exemplary embodiments, a distance between adjacent grooves is between ⅛ and ⅞ of a distance between an edge of an opening area of a black matrix and an edge of the pixel opening formed in the pixel definition layer.

In some other exemplary embodiments, the first concave portion is an aperture surrounding the pixel opening, and a width of the aperture is between 0.5 microns and 1.8 microns.

In some exemplary embodiments, multiple apertures form multiple annular structure units each including N annular structures disposed around the pixel opening and parallel to each other, wherein an innermost annular structure includes multiple first apertures, the first aperture is adjacent to the pixel opening, serrated protrusions are formed between the multiple apertures, and a width of each serrated protrusion is between 0.8 microns and 1.5 microns, with N being a natural number greater than 1.

In some exemplary embodiments, N is a natural number between 1 and 50.

In some exemplary embodiments, N is 3.

In some exemplary embodiments, the light emitting structure layer further includes an organic light emitting layer 52 and a cathode 53, wherein the organic light emitting layer 52 is disposed on the anode 51. The cathode 53 is disposed on the organic light emitting layer 52, the organic light emitting layer 52 is connected to the anode 51, and the cathode 53 is connected to the organic light emitting layer 52, and the organic light emitting layer 52 emits light of a corresponding color under driving of the anode 51 and the cathode 53. The organic light emitting layer 52 and the cathode 53 have a non-flat surface at position(s) corresponding to the first concave-convex structure and/or the second concave-convex structure.

In some exemplary embodiments, the organic light emitting layer 52 may include a hole injection layer (HIL), a hole transport layer (HTL), an electron block layer (EBL), an emitting layer (EML), a hole block layer (HBL), an electron transport layer (ETL), and an electron injection layer (EIL) which are stacked. In some exemplary embodiments, the hole injection layer, the hole transport layer, the electron block layer, the hole block layer, the electron transport layer and the electron injection layer of all sub-pixels may be a common layer in which they are connected together, and the emitting layers of all sub-pixels may be a common layer in which they are connected together, or may be isolated from each other, and the emitting layers of adjacent sub-pixels may overlap slightly. In some possible implementations, the display substrate may include other film layers, which are not limited here in the present disclosure.

In some exemplary embodiments, the display substrate further includes an encapsulation layer 98 disposed on a side of the light emitting structure layer away from the base substrate. The encapsulation layer 98 may include a first encapsulation layer, a second encapsulation layer, and a third encapsulation layer that are stacked. The first encapsulation layer and the third encapsulation layer may be made of an inorganic material, the second encapsulation layer may be made of an organic material, and the second encapsulation layer is disposed between the first encapsulation layer and the third encapsulation layer, which may ensure that external water vapor cannot enter the light emitting structure layer.

In some exemplary embodiments, the base substrate includes a base substrate 10 and a drive structure layer 102 disposed on the base substrate 10. The base substrate 10 may be a flexible base substrate or may be a rigid base substrate. The drive structure layer 102 of each sub-pixel may include a pixel drive circuit composed of multiple transistors and a storage capacitor. The anode 51 is connected to a first thin film transistor in the drive structure layer through a via hole provided on the planarization layer 95.

In some exemplary embodiments, as shown in FIG. 4, the display substrate further includes a color filter layer disposed on a side of the encapsulation layer 98 away from the base substrate, the color filter layer includes a black matrix 71 and a color filter 72 that are disposed at an interval. The black matrix 71 has multiple opening areas arranged in a matrix, and the color filter 72 is filled in an opening area. In an exemplary embodiment, the color filter 72 and the black matrix 71 at least include a partially overlapping area. In the overlapping area of the black matrix 71 and the color filter 72, the color filter 72 covers the black matrix 71.

In some exemplary embodiments, the display substrate further includes a touch structure layer 103 disposed between the encapsulation layer 98 and the color filter layer. The touch structure layer 103 may include multiple touch electrodes, wherein an orthographic projection of the black matrix 71 on the base substrate includes an orthographic projection of the touch electrodes on the base substrate.

The technical solution of this embodiment is further described below through a preparation process of the display substrate in this embodiment. A "patterning process" mentioned in this embodiment includes processing such as film layer deposition, photoresist coating, mask exposure, developing, etching and photoresist stripping. A "photolithography process" mentioned in this embodiment includes processing such as film layer coating, mask exposure and development, and is a mature preparation process in related technologies. The deposition may be any one or more of sputtering, evaporation, and chemical vapor deposition, the coating may be any one or more of spray coating and spin coating, and the etching may be any one or more of dry etching and wet etching. A "thin film" refers to a layer of a thin film prepared from a material on a base substrate using a process of deposition or coating. If the "thin film" does not need a patterning process in an entire manufacturing process, the "thin film" may also be called a "layer". If the "thin film" needs a patterning process in the entire manufacturing process, the "thin film" is called a "thin film" before the patterning process and is called a "layer" after the patterning process. The "layer" after the patterning process includes at least one "pattern". "A and B are disposed in a same layer" mentioned in the present disclosure means that A and B are simultaneously formed through a same patterning process. "An orthographic projection of A contains an orthographic projection of B" means that the orthographic projection of B falls within a range of the orthographic projection of A, or the orthographic projection of A covers the orthographic projection of B.

In some exemplary embodiments, a preparation process of the display substrate in FIG. 4 may include the following steps.

(1) A flexible base substrate 10 is prepared on a glass carrier plate 1.

In an example of an embodiment of the present disclosure, the flexible base substrate 10 may have two layers of flexible layer structure. The flexible base substrate 10 includes a first flexible material layer, a first inorganic material layer, a semiconductor layer, a second flexible material layer and a second inorganic material layer which are stacked on the glass carrier plate 1. The first flexible material layer and the second flexible material layer may be made of polyimide (PI), polyethylene terephthalate (PET) or surface-treated polymer soft film, etc. The first inorganic material layer and the second inorganic material layer may be made of silicon nitride (SiNx) or silicon oxide (SiOx), etc. to improve water and oxygen resistance of the base substrate. The first inorganic material layer and the second inorganic material layer are also called barrier layers. The semiconductor layer may be made of amorphous silicon (a-si).

Figure 6:
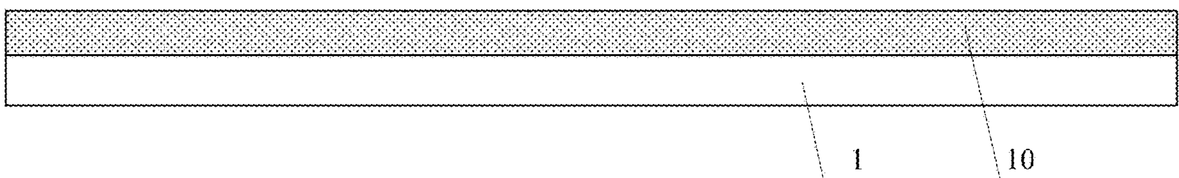
FIG. 6 is a schematic diagram of a structure of a display substrate after a pattern of a flexible base substrate is prepared according to an embodiment of the present disclosure.

In some exemplary embodiments, taking a stacked structure PI1/Barrier1/a-si/PI2/Barrier2 as an example, the preparation process of the flexible base substrate 10 may include: first, coating a layer of polyimide on the glass carrier plate 1 which cures into a film to form a first flexible (PI1) layer; subsequently, depositing a layer of a barrier thin film on the first flexible layer to form a first barrier (Barrier1) layer covering the first flexible layer; then depositing a layer of an amorphous silicon thin film on the first barrier layer to form an amorphous silicon (a-si) layer covering the first barrier layer; then coating a layer of polyimide on the amorphous silicon layer which cures into a film to form a second flexible (PI2) layer; then depositing a layer of a barrier thin film on the second flexible layer to form a second barrier (Barrier2) layer covering the second flexible layer, thereby completing the preparation of the flexible base substrate 10, as shown in FIG. 6.

In other examples, the flexible base substrate 10 may have one layer of flexible layer structure, for example, the flexible base substrate 10 includes a flexible (PI) layer and a barrier layer which are stacked.

(2) A pattern of a drive structure layer 102 is prepared on the flexible base substrate 10. The drive structure layer includes multiple gate lines and multiple data lines, wherein the multiple gate lines and the multiple data lines cross vertically to define multiple pixel units arranged in a matrix. Each pixel unit includes at least 3 sub-pixels, at least one sub-pixel includes at least one first Thin Film Transistor (TFT) (in a possible embodiment, in an under-screen camera area, at least one sub-pixel is provided with no TFT, but is only provided with an anode). The first thin film transistor may be in a bottom gate structure, and may also be in a top gate structure; may be an amorphous silicon (a-Si) thin film transistor, and may also be a low temperature polysilicon (LTPS) thin film transistor or an oxide thin film transistor, which is not limited here. In this embodiment, one pixel unit includes three sub-pixels, namely a red sub-pixel R, a green sub-pixel G, and a blue sub-pixel B respectively. Of course, the solution of this embodiment is also applicable to a case where one pixel unit includes four sub-pixels (a red sub-pixel R, a green sub-pixel G, a blue sub-pixel B, and a white sub-pixel W). In some exemplary embodiments, the preparation process of the drive structure layer may include the following steps.

A first insulating thin film and an active layer thin film are sequentially deposited on the flexible base substrate 10, the active layer thin film is patterned through a patterning process to form a first insulating layer 91 covering the entire flexible base substrate 10 and a pattern of an active layer disposed on the first insulating layer 91. The active layer at least includes a first active layer 11. In an exemplary embodiment, the first insulating layer 91 is referred to as a buffer layer, and is used for improving water and oxygen resistance of the base substrate.

Then, a second insulating thin film and a first metal thin film are deposited sequentially, and the first metal thin film is patterned through a patterning process to form a second insulating layer 92 covering the active layer and a pattern of a first gate electrode layer arranged on the second insulating layer 92. The first gate electrode layer at least includes a first gate electrode 21, a first capacitor electrode 22, multiple gate lines (not shown) and multiple gate leads (not shown). In an exemplary embodiment, the second insulating layer 92 is referred to as a first gate insulating (GI1) layer.

Then, a third insulating thin film and a second metal thin film are deposited sequentially, and the second metal thin film is patterned through a patterning process to form a third insulating layer 93 covering the first gate electrode layer and a pattern of a second gate electrode layer arranged on the third insulating layer 93. The second gate electrode layer at least includes a second capacitor electrode 31 and a second gate lead (not shown), wherein a position of the second capacitor electrode 31 corresponds to a position of the first capacitor electrode 22. In an exemplary embodiment, the third insulating layer 93 is also referred to as a second gate insulating (GI2) layer.

Next, a fourth insulating thin film is deposited, and the fourth insulating thin film is patterned through a patterning process to form a pattern of a fourth insulating layer 94 covering the second gate electrode layer. Multiple first via holes are formed on the fourth insulating layer 94, wherein positions of the multiple first via holes respectively correspond to positions of the two ends of the first active layer, and the fourth insulating layer 94, the third insulating layer 93 and the second insulating layer 92 in the multiple first via holes are etched away to respectively expose a surface of the first active layer. In an exemplary embodiment, the fourth insulating layer 94 is also referred to as an interlayer insulating (ILD) layer.

Then, a third metal thin film is deposited, and the third metal thin film is patterned through a patterning process to form a pattern of a source-drain metal layer (SD) on the fourth insulating layer 94. The source-drain metal layer at least includes patterns of a first source electrode 41, a first drain electrode 42, a low voltage (VSS) line (not shown), multiple data lines (not shown) and multiple data leads (not shown). The first source electrode 41 and the first drain electrode 42 are respectively connected to the two ends of the first active layer 11 through the first via hole. In an exemplary implementation, according to actual needs, the source-drain metal layer may further include any one or more of a power supply line (VDD), a compensation line and an auxiliary cathode.

Figure 7:
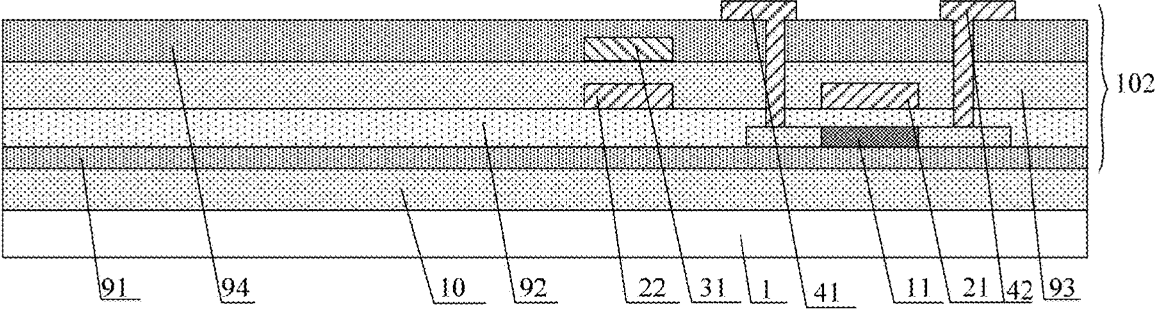
FIG. 7 is a schematic diagram of a structure of a display substrate after a pattern of a drive structure layer is prepared according to an embodiment of the present disclosure.

At this point, the pattern of the drive structure layer has been prepared on the flexible base substrate 10, as shown in FIG. 7. The first active layer 11, the first gate electrode 21, the first source electrode 41 and the first drain electrode 42 form the first thin film transistor, the first capacitor electrode 22 and the second capacitor electrode 31 form the storage capacitor, and the multiple gate leads and data leads form drive leads of Gate Driver on Array (GOA).

Figure 8:
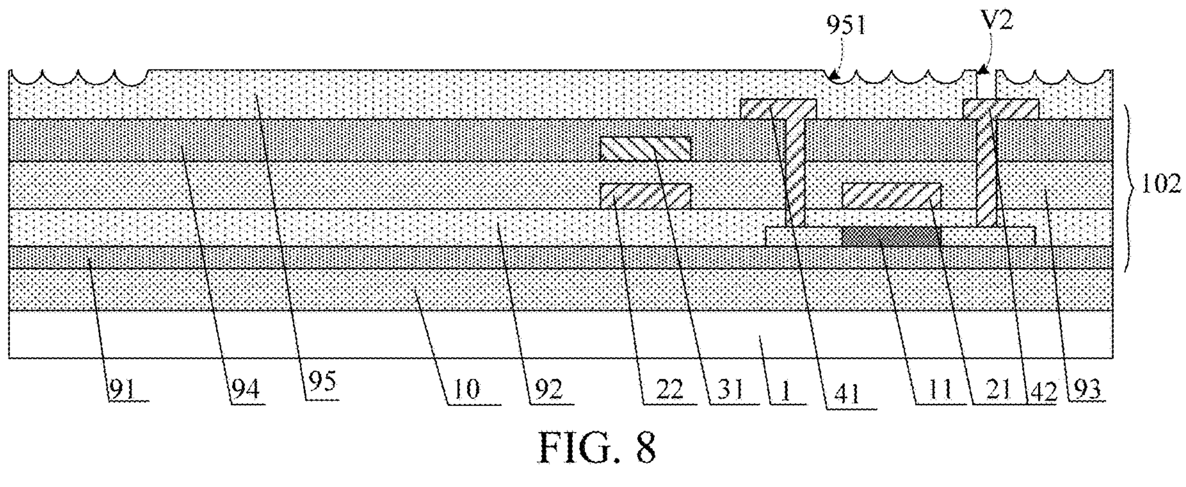
FIG. 8 is a schematic diagram of a structure of a display substrate after a pattern of a planarization layer is formed according to an embodiment of the present disclosure.

(3) A first planarization thin film is coated on the flexible base substrate on which the above patterns are formed, and the first planarization thin film is patterned through a patterning process to form a planarization (PLN) layer 95 covering the entire flexible base substrate 10, as shown in FIG. 8. A second via hole V2 is provided on the planarization layer 95, the planarization layer 95 in the second via hole V2 is etched away to expose a surface of the first drain electrode 42 of the first thin film transistor, a second concave-convex structure 951 is disposed on a side of the planarization layer 95 away from the flexible base substrate 10, and there is an overlapping area between an orthographic projection of the second concave-convex structure 951 on the flexible base substrate 10 and an orthographic projection of a subsequently formed anode 51 on the flexible base substrate 10, i.e., the planarization layer 95 is formed with an undulating shape at a corresponding position of the anode 51.

In some exemplary embodiments, the second concave-convex structure 951 includes multiple second convex portions, and a second concave portion is formed between adjacent second convex portions.

In this embodiment, at the time of patterning the first planarization thin film, an opening pattern on a mask may correspond to a second concave portion of the second concave-convex structure 951. In this way, the position, shape and arrangement of the opening pattern of the mask may be designed according to the desired second concave-convex structure 951, which is conducive to simplifying the manufacturing process of the display substrate.

In some exemplary embodiments, the second convex portion may be serrated.

In some exemplary embodiments, as shown in FIG. 4, a segment difference h1 between a second convex portion and a second concave portion may be between ⅛ and ⅞ of a thickness h2 of the planarization layer 95.

In some exemplary embodiments, the segment difference between the second convex portion and the second concave portion may be 0.2 microns to 0.8 microns. In this embodiment, the segment difference between the second convex portion and the second concave portion refers to a segment difference between a highest point of the second convex portion and a lowest point of the second concave portion.

(4) A transparent conductive thin film is deposited on the base substrate on which the above patterns are formed, and the transparent conductive thin film is patterned through a patterning process to form a pattern of an anode 51. The anode 51 is connected to the first drain electrode D through the second via hole V2. Since the planarization layer 95 at the corresponding position of the anode 51 has an undulating shape on the side away from the flexible base substrate, the anode 51 may also be formed with an undulating shape, thus forming a diffuse reflective anode surface.

Figure 9:
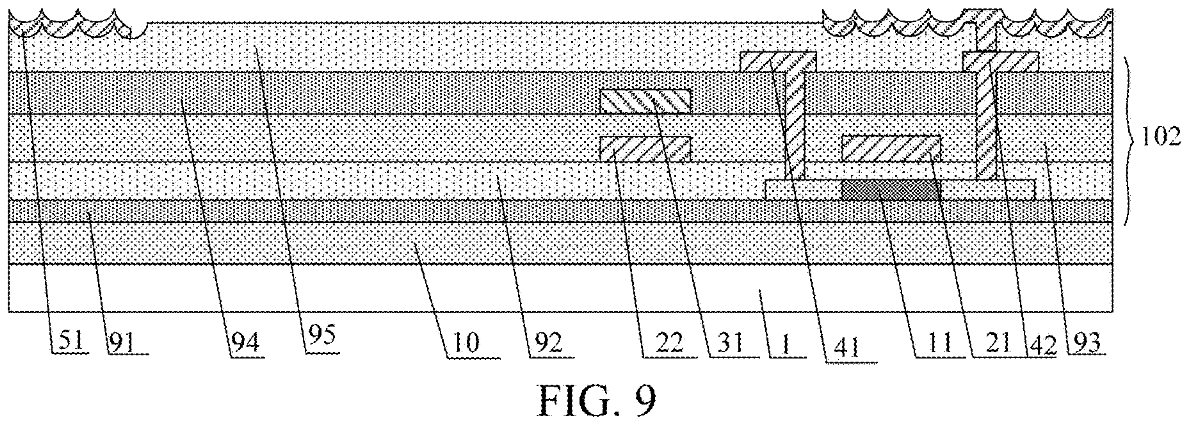
FIG. 9 is a schematic diagram of a structure of a display substrate after a pattern of an anode is formed according to an embodiment of the present disclosure.

In some exemplary embodiments, forming the pattern of the anode 51 includes: depositing a fourth metal thin film on the base substrate on which the above patterns are formed, coating a layer of photoresist on the fourth metal thin film, exposing the photoresist with a single tone mask to form an unexposed area at a position where the anode 51 is located, and form a completely exposed area at other positions, developing and removing the photoresist in the completely exposed area, then etching away the fourth metal thin film in the completely exposed area, and stripping the photoresist to form the pattern of the anode 51, as shown in FIG. 9.

Since the display substrate in this embodiment has a top emission structure, the anode 51 is a reflective electrode and may be made of metals with high reflectivity, such as silver (Ag), gold (Au), palladium (Pd), platinum (Pt), etc., or alloys of these metals, or composite layers of these metals. In practice, a composite layer structure of an indium tin oxide (ITO) layer and a metal reflective layer may also be adopted, which has good conductivity, high reflectivity and good morphological stability.

Figure 10:
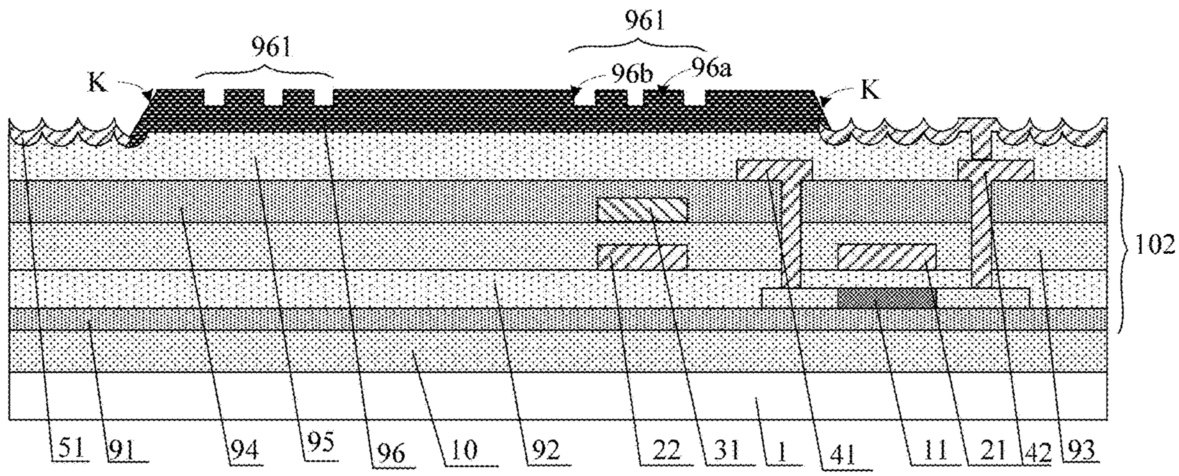
FIG. 10 is a schematic diagram of a structure of a display substrate after a pattern of a pixel definition layer is formed according to an embodiment of the present disclosure.

(5) A pixel definition thin film is coated on the base substrate on which the above patterns are formed, and a pattern of a pixel definition layer (PDL) 96 is formed through masking, exposure and development processes, as shown in FIG. 10. A pixel opening K is provided on the pixel definition layer 96, the pixel definition thin film in the pixel opening K is developed away to expose a surface of at least part of the anode 51, and a first concave-convex structure 961 is disposed on a side of the pixel definition layer 96 away from the flexible base substrate 10. The pixel opening K and the first concave-convex structure 961 may be implemented by a gray-scale mask design.

In some exemplary embodiments, an orthographic projection of the first concave-convex structure 961 on the flexible base substrate 10 does not overlap with an orthographic projection of the pixel opening K on the flexible base substrate 10.

In some exemplary embodiments, the first concave-convex structure 961 is located at a side of the pixel definition layer 96 close to a subsequently formed organic light emitting layer 52, so that an undulating shape may be formed at an edge position of the pixel definition layer 96 close to a light emitting area.

In some exemplary embodiments, as shown in FIG. 10, the first concave-convex structure 961 includes multiple first convex portions 96*a*, and first concave portions 96*b* are formed between adjacent first convex portions. In an embodiment of the present disclosure, the pixel definition layer in the pixel opening K is completely developed away, and the pixel definition layer in the first concave portion 96*b* is partially developed away, so as to prevent a cathode and an anode to be formed subsequently from short-circuiting through the first concave portion 96*b*.

Figure 11:
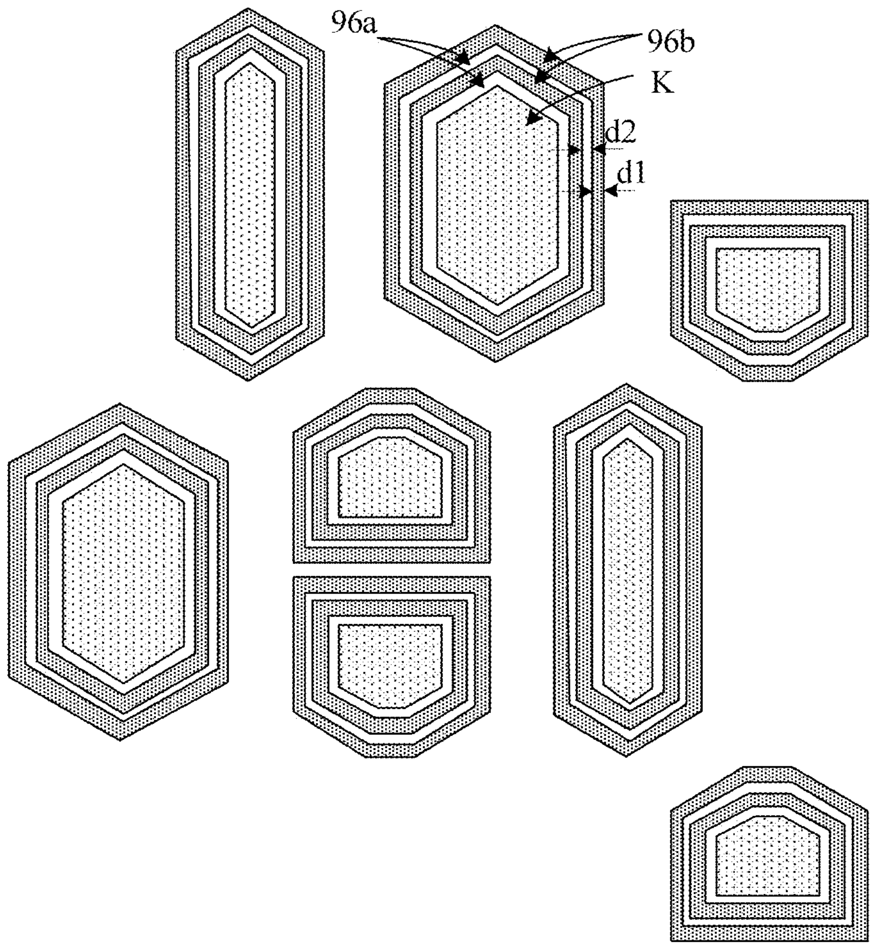
FIG. 11 and FIG. 12 are schematic diagrams of structures of two pixel definition layers according to an embodiment of the present disclosure.

In some exemplary embodiments, as shown in FIG. 4 and FIG. 11, the first concave portion 96*b* is a groove surrounding the pixel opening K, a width d1 of the groove may be determined according to a resolution limit of a current exposure device, and a distance d2 between adjacent grooves is between ⅛ and ⅞ of a distance d3 between an edge of an opening area of a subsequently formed black matrix 71 and an edge of the pixel opening K formed in the pixel definition layer 96.

In some exemplary embodiments, as shown in FIG. 11, the first concave portion 96*b* is a groove surrounding the pixel opening K, wherein a width d1 of the groove is between 0.8 microns and 1.5 microns, and a distance d2 between adjacent grooves is between 1 micron and 2 microns.

Figure 12:
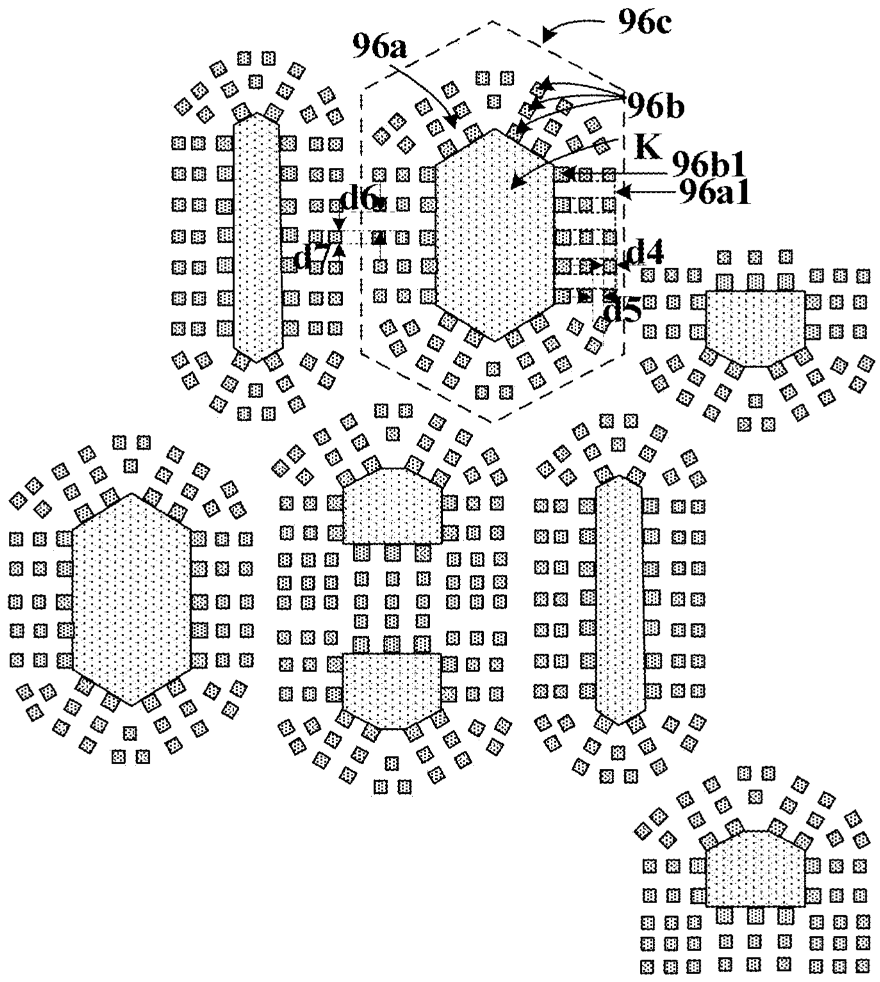

In some other exemplary embodiments, as shown in FIG. 4 and FIG. 12, the first concave portion 96*b* includes an aperture surrounding the pixel opening K, wherein a width d4 of the aperture may be determined according to a resolution limit of a current exposure device. A distance d5 between adjacent apertures is between ⅛ and ⅞ of a distance d3 between an edge of an opening area of a subsequently formed black matrix 71 and an edge of the pixel opening K formed in the pixel definition layer 96.

As an example, the width d4 of the aperture may be between 0.5 microns and 1.8 microns.

In some exemplary embodiments, as shown in FIG. 12, multiple apertures form multiple annular structure units 96*c*, wherein each annular structure unit includes N annular structures disposed around the pixel opening K and parallel to each other. An innermost annular structure includes multiple first apertures 96*b*1, the first apertures 96*b*1 are adjacent to the pixel opening K, and serrated protrusions

**96*al* are formed between the multiple first apertures 96*b*1**, with N being a natural number greater than 1.

In some exemplary embodiments, as shown in FIG. 12, a width d6 of a serrated protrusion **96*al* may be determined according to a resolution limit of a current exposure device. A distance d7 between adjacent serrated protrusions 96*al* is between ⅛ and ⅞ of a distance between an edge of an opening area of a subsequently formed black matrix 71 and an edge of the pixel opening K formed in the pixel definition layer 96**.

As an example, the width d6 of the serrated protrusion **96*al*** is between 0.8 microns and 1.5 microns.

In some exemplary embodiments, N is between 1 and 50. As an example, N may be 3.

In this embodiment, the width of the aperture is set to be between 0.5 microns and 1.8 microns, which may ensure that the designed aperture is not exposed to be through while the pixel opening is exposed to be opened, so that the pixel definition layer 96 may be formed with an undulating shape, and then at the time of depositing the cathode 53 subsequently, the cathode 53 may also be formed with an undulating shape, thus forming a scattering cathode surface.

Figure 13:
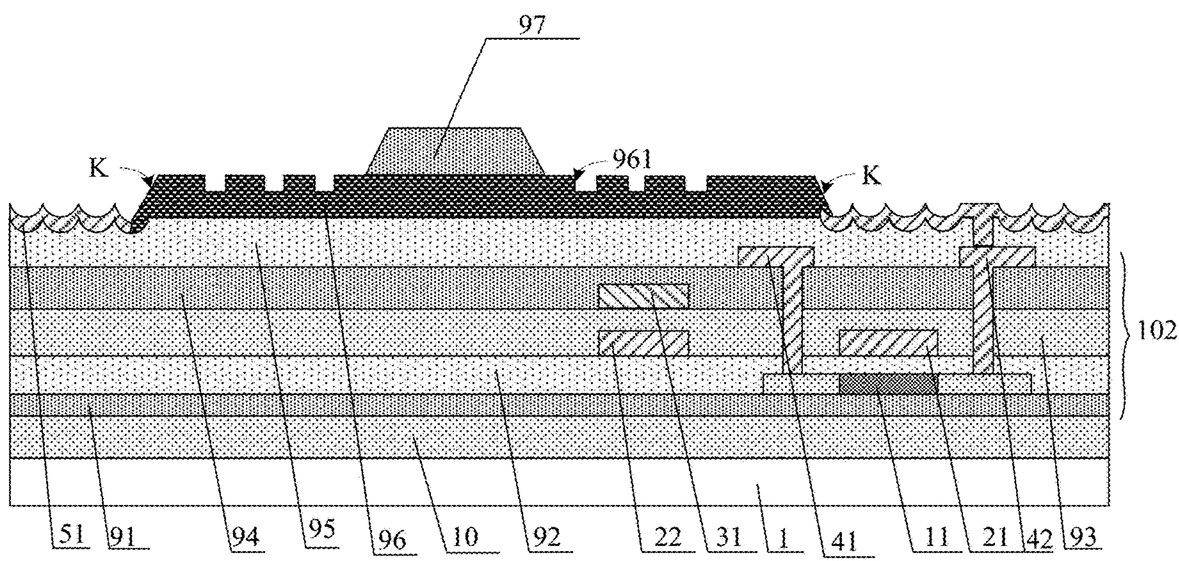
FIG. 13 is a schematic diagram of a structure of a display substrate after a pattern of a post spacer layer is formed according to an embodiment of the present disclosure.

(6) A thin film of an organic material is coated on the base substrate on which the above patterns are formed, and a pattern of a post spacer (PS) layer 97 is formed through masking, exposure and development processes, as shown in FIG. 13.

Figure 14:
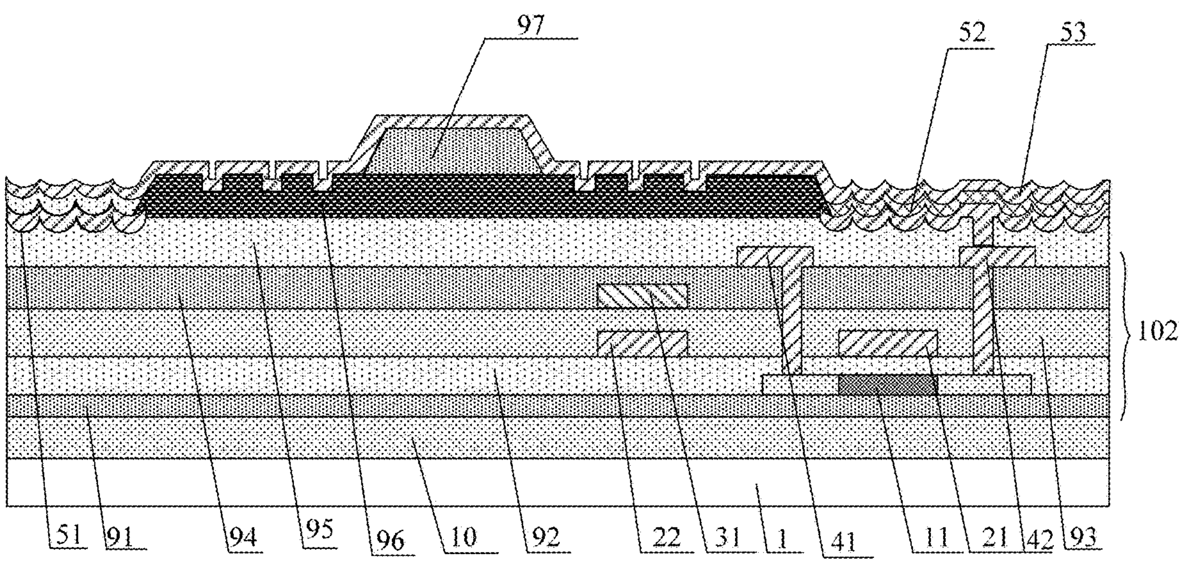
FIG. 14 is a schematic diagram of a structure of a display substrate after a pattern of a cathode is formed according to an embodiment of the present disclosure.

(7) An organic light emitting layer 52 and a cathode 53 are sequentially formed on the base substrate on which the above patterns are formed, as shown in FIG. 14. The organic light emitting layer 52 includes a hole injection layer, a hole transport layer, a light emitting layer, an electron transport layer and an electron injection layer which are stacked, and it is formed in the pixel opening to implement connection between the organic light emitting layer 52 and the anode 51. Since the anode 51 is connected to the first drain electrode 42 of the first transistor, light emission control of the organic light emitting layer 52 is achieved. The cathode 53 is connected to the organic light emitting layer 52. Since both the anode 51 and the pixel definition layer 96 have an undulating shape, the organic light emitting layer 52 and the cathode 53 may also each have an undulating shape, thus forming a scattering cathode surface. In an exemplary embodiment, the cathode 53 may be in an integral structure.

At this point, the pattern of the light emitting structure layer has been prepared on the drive circuit layer. The light emitting structure layer includes an anode, a pixel definition layer, a post spacer layer, an organic light emitting layer and a cathode. The organic light emitting layer is respectively connected to the anode and the cathode.

Figure 15:
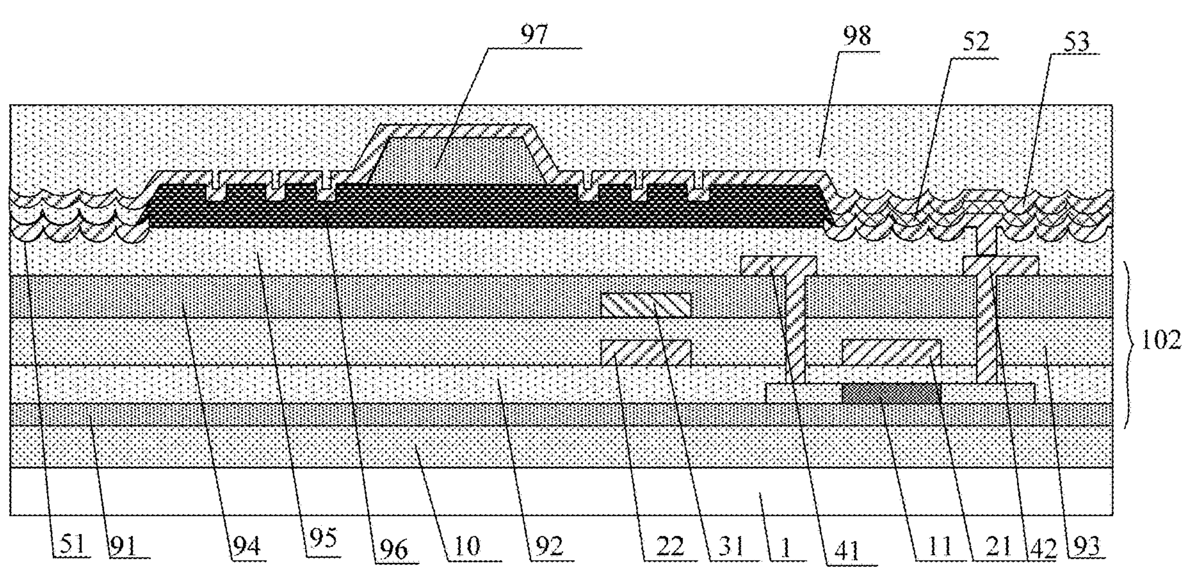
FIG. 15 is a schematic diagram of a structure of a display substrate after a pattern of an encapsulation layer is formed according to an embodiment of the present disclosure.

(8) A pattern of an encapsulation layer 98 is formed on the base substrate on which the above patterns are formed, as shown in FIG. 15. The encapsulation layer 98 may have an inorganic material/organic material/inorganic material stacked structure, in which an organic material layer is disposed between two inorganic material layers.

In some exemplary embodiments, forming the pattern of the encapsulation layer 98 may include: first depositing a first inorganic thin film by using an open mask through plasma enhanced chemical vapor deposition (PECVD) to form a first encapsulation layer; then ink-jet printing an organic material on the first encapsulation layer through an ink-jet printing process, which cures into a film to form a second encapsulation layer; and then depositing a second inorganic thin film by using an open mask to form a third encapsulation layer, wherein the first encapsulation layer, the second encapsulation layer and the third encapsulation layer form the encapsulation layer. In some exemplary embodiments, the first encapsulation layer and the third encapsulation layer may be made of any one or more of silicon oxide (SiOx), silicon nitride (SiNx), and silicon oxynitride (SiON), and may be in a single layer, multiple layers, or a composite layer, and the second encapsulation layer may be made of a resin material, thereby forming an inorganic material/organic material/inorganic material stacked structure, in which an organic material layer is disposed between two inorganic material layers, thus ensuring that external water vapor cannot enter the light emitting structure layer.

Figure 16:
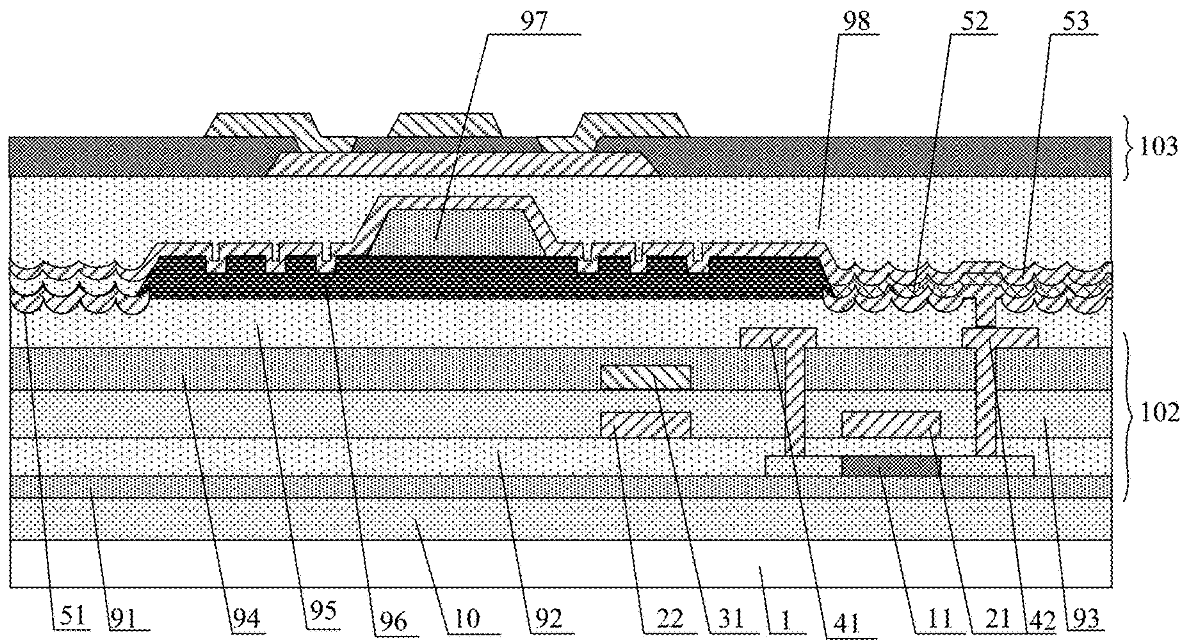
FIG. 16 is a schematic diagram of a structure of a display substrate after a pattern of a touch structure layer is formed according to an embodiment of the present disclosure.

(9) A pattern of a touch structure layer 103 is formed on the base substrate on which the above patterns are formed, as shown in FIG. 16.

In some exemplary embodiments, the touch structure layer 103 may include a buffer layer, a first touch electrode layer (i.e., a bridging layer), a touch insulating layer (TLD), a second touch electrode layer and a protective layer that are stacked on the encapsulation layer 98. Multiple first touch electrodes, multiple second touch electrodes, and multiple first connection parts may be arranged in a same layer in the second touch electrode layer, and may be formed through a same patterning process, and the first touch electrodes and the first connection parts may be connected to each other to form an integral structure. Second connection parts may be disposed in the first touch electrode layer to make adjacent second touch electrodes connected to each other through a via hole, and a touch insulating layer is disposed between the second touch electrode layer and the first touch electrode layer.

In some possible implementations, the multiple first touch electrodes, the multiple second touch electrodes, and multiple second connection parts may be disposed in a same layer in the second touch electrode layer, the second touch electrodes and the second connection parts may be connected to each other to form an integral structure, and the first connection parts may be disposed in the first touch electrode layer to make adjacent first touch electrodes connected to each other through via holes.

Figure 17:
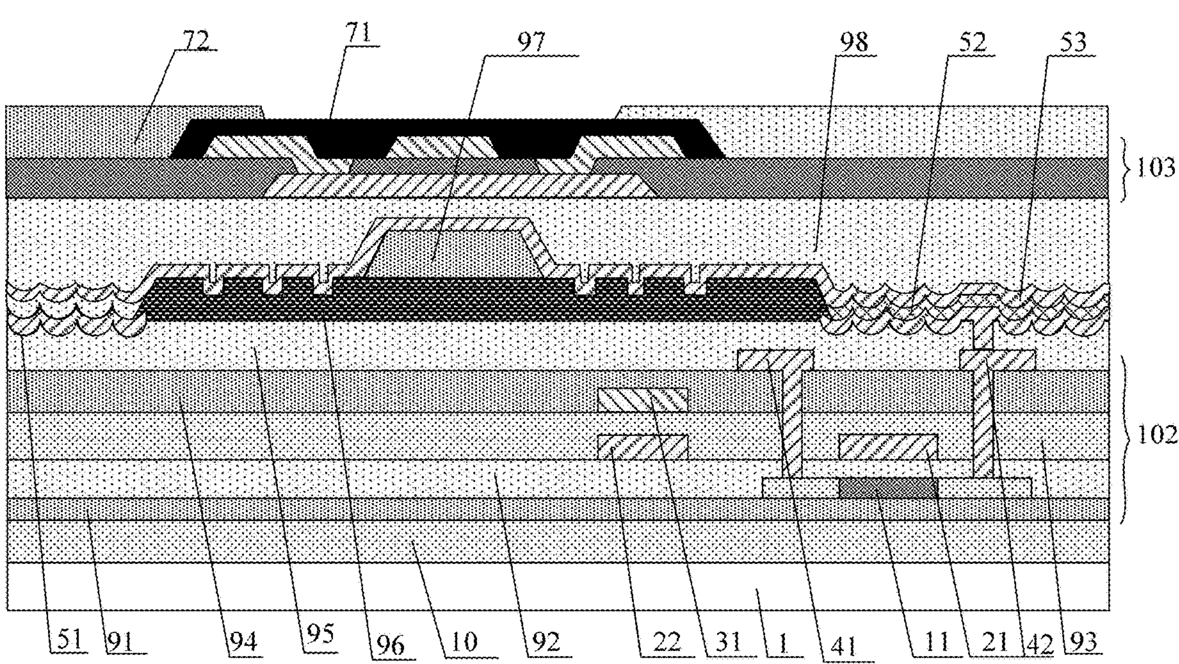
FIG. 17 is a schematic diagram of a structure of a display substrate after a pattern of a color filter layer is formed according to an embodiment of the present disclosure.

(10) A pattern of a color filter layer is formed on the base substrate on which the above patterns are formed. The color filter layer includes a black matrix 71 and a color filter 72 arranged in a same layer. The black matrix 71 has multiple opening areas arranged in a matrix. The color filter 72 is filled in an opening area. The color filter 72 and the black matrix 71 at least include a partially overlapping area in which the color filter 72 covers the black matrix 71, as shown in FIG. 17.

In some exemplary embodiments, forming the pattern of the color filter layer includes: first coating a polymer photoresist layer mixed with a black matrix material on the base substrate on which the above patterns are formed, to form a pattern of a black matrix 71 through exposing and developing; then coating a polymer photoresist layer mixed with red pigments on the base substrate on which the above patterns are formed, to form a pattern of a red area through exposing and developing; and sequentially forming a pattern of a green area and a pattern of a blue area by using the same method and steps. Finally, color filters 72 of three primary colors of red, green, and blue arranged according to a certain rule are formed.

Figure 18:
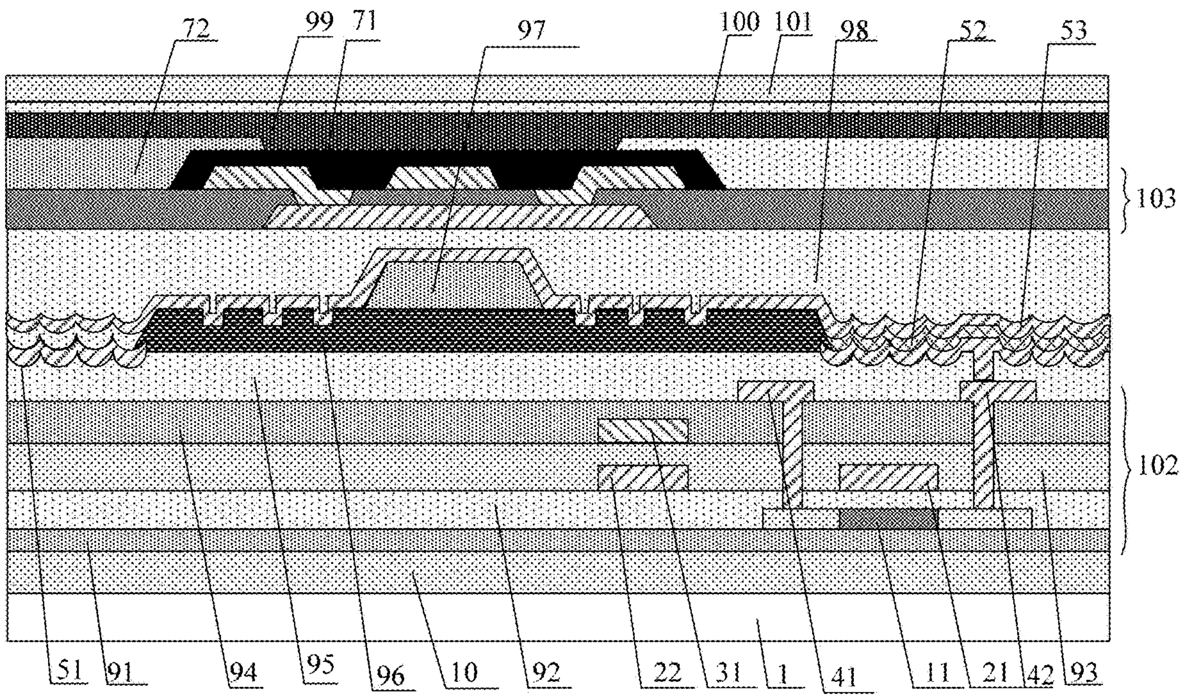
FIG. 18 is a schematic diagram of a structure of a display substrate after a cover plate is attached according to an embodiment of the present disclosure.

(11) A thin film encapsulation process is performed on the base substrate on which the above patterns are formed to form a pattern of a coating protective layer 99, and an optical glue 100 is coated on the base substrate on which the pattern of the coating protective layer 99 is formed, and a cover plate 101 is attached to the optical glue 100, as shown in FIG. 18.

(12) After the above film layer structures have been prepared, the display substrate is stripped off from the glass carrier plate 1 by a peeling process, and then a layer of bottom film is attached to the back of the display substrate (a surface of the flexible base substrate 10 away from the film layer) by using roller attaching, as shown in FIG. 4.

Through the above processes, the preparation of the display substrate shown in FIG. 4 in this embodiment has been completed. Although the display substrate of this embodiment is described as having a top emission structure, the solution of this embodiment is also applicable to a bottom emission structure or a double-sided emission structure, and is also applicable to large-sized or small-sized display substrates.

The structure shown in the present disclosure and the preparation process thereof are merely an exemplary description. In an exemplary implementation, a corresponding structure may be altered and patterning processes may be increased or reduced according to actual needs. For example, each display unit may include 3 or 4 sub-pixels. As another example, the pixel drive circuit may be 5T1C or 7T1C. As a further example, other electrodes or leads may also be provided in the film layer structure, which is not specifically limited here in the present disclosure. In an exemplary embodiment, the source-drain metal layer may also have a double-layer structure, i.e., on a plane perpendicular to the display substrate, the display substrate includes a first insulating layer, an active layer, a second insulating layer, a first gate electrode layer, a third insulating layer, a second gate electrode layer, a fourth insulating layer, a first source-drain electrode layer, a first planarization layer, a second source-drain electrode layer and a second planarization layer that are sequentially formed on the base substrate, the second source-drain electrode layer at least includes an anode connection electrode connected to the drain electrode of the first thin film transistor through a via hole on the first planarization layer and connected to the anode through a via hole on the second planarization layer.

As can be seen from the structure and preparation process of the display substrate described above, in the display substrate according to the present disclosure, by performing gently undulating processing on the planarization layer directly opposite to the anode, the anode is formed with a certain undulating shape, i.e., a diffuse reflection anode is formed; and by performing gently undulating processing on the pixel definition layer, the pixel definition layer is formed with an undulating shape, so that at the time of depositing the cathode, the cathode may also be formed with an undulating shape, i.e., a scattering cathode surface is formed. In this way, when external ambient light enters the screen in the screen-off state, scattering cathode and anode may scatter light, destroy an exit direction of ambient light, improve the color separation phenomenon, and achieve a better screen-off effect, which avoids the problem that doping scattering particles in the coating protective layer will reduce transmittance, has no cost increase, and may maintain the advantage of high transmittance of COE and meet the requirements of future 5G and low-power flexible products.

Figure 19:
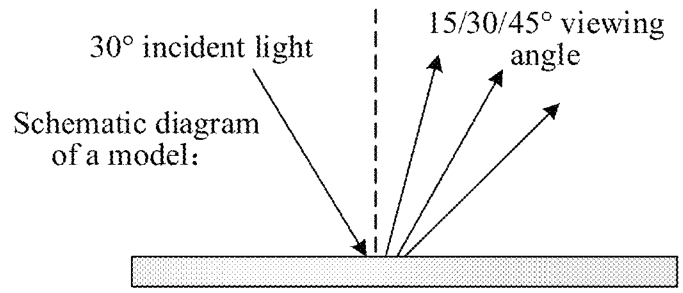
FIG. 19 is a schematic diagram of a structure of an optically improved color separation test model according to an embodiment of the present disclosure.
Figure 20A:
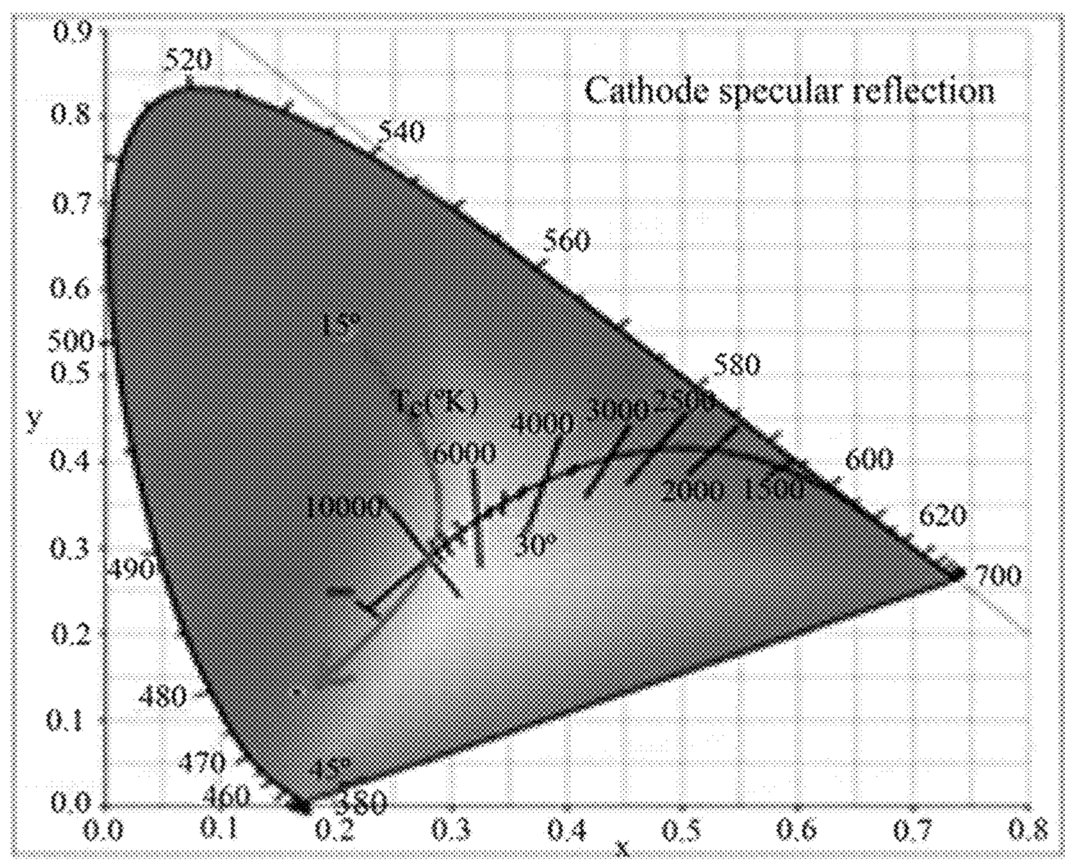
FIG. 20*a* and FIG. 20*b* are schematic diagrams of simulation results when incident light is in a long axis direction of a color filter in FIG. 19.
Figure 20B:
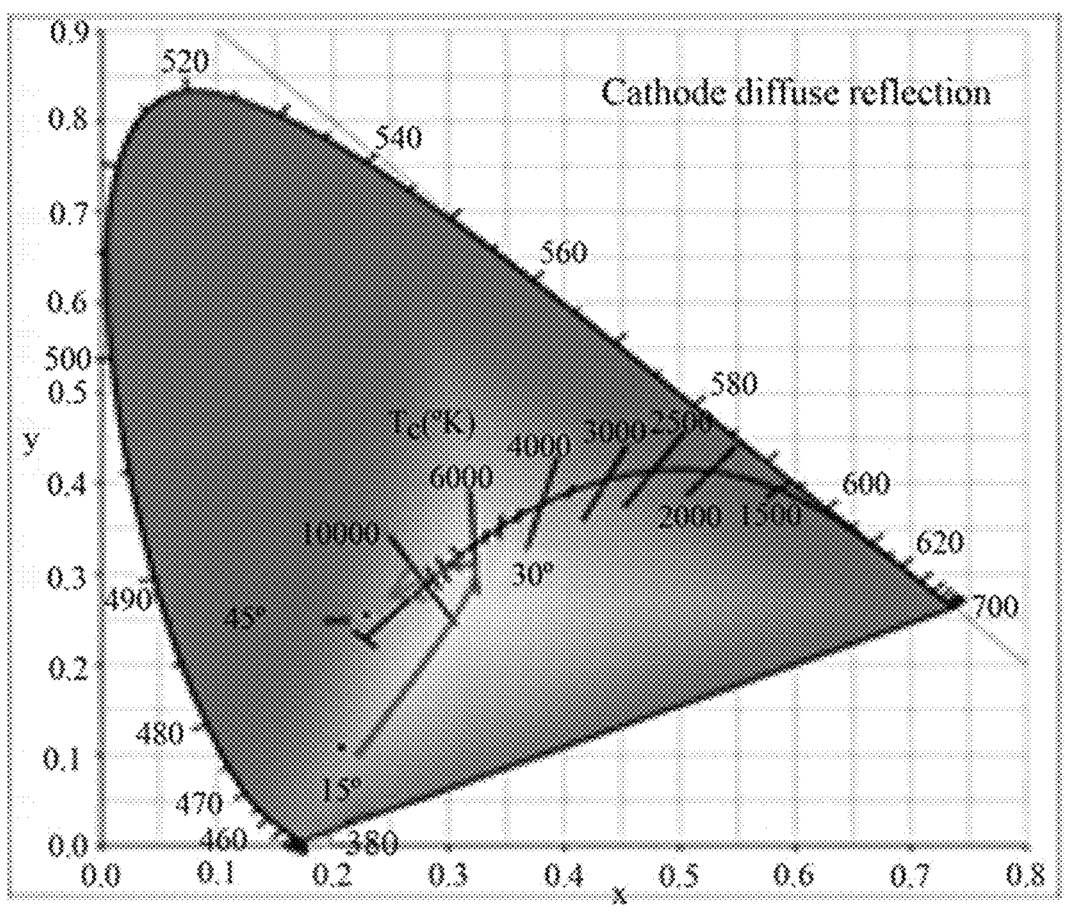
Figure 21A:
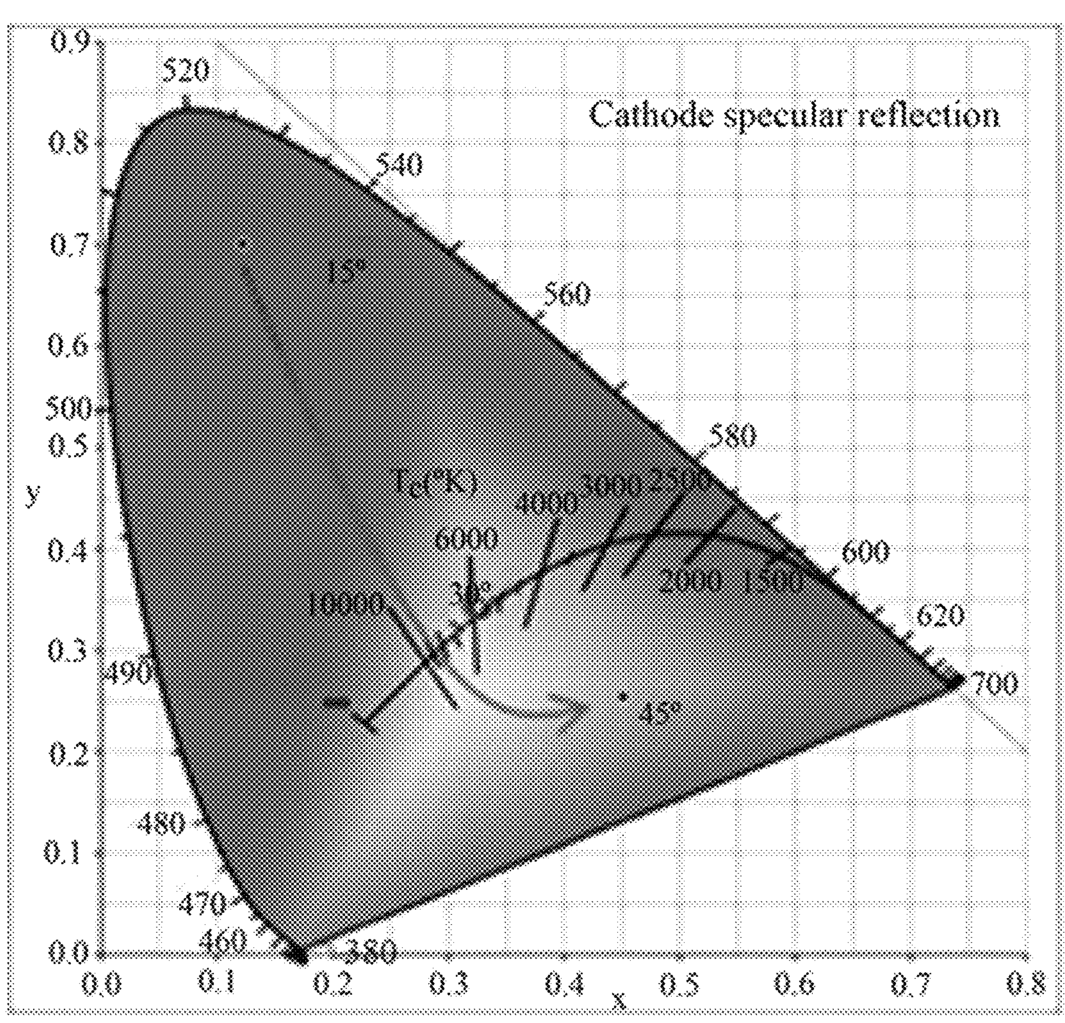
FIG. 21*a* and FIG. 21*b* are schematic diagrams of simulation results when incident light is in a short axis direction of a color filter in FIG. 19.
Figure 21B:
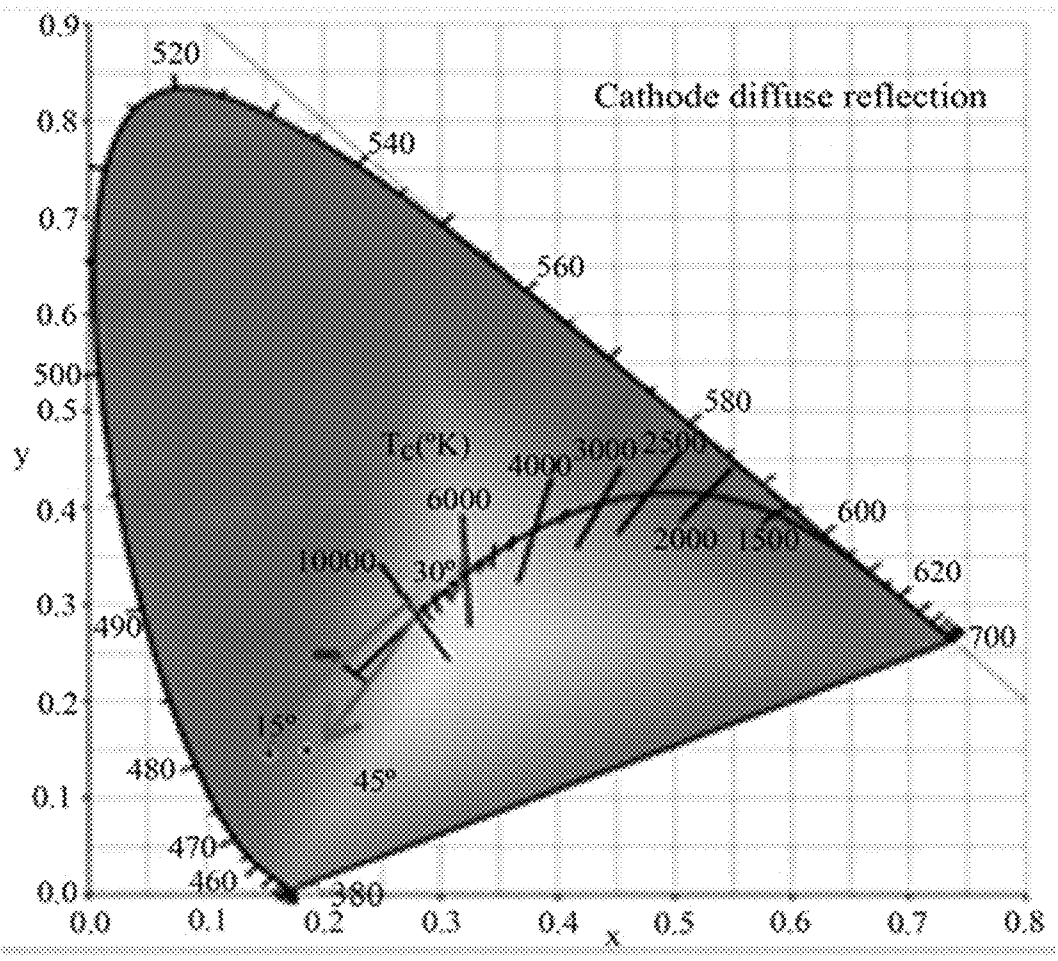

An optically improved color separation test model is shown in FIG. 19. Simulation results are shown in FIG. 20*a*, FIG. 20*b* and Table 1 when incident light is in a long axis direction of a color filter (CF), and simulation results are shown in FIG. 21*a*, FIG. 21*b* and Table 2 when incident light is in a short axis direction of the color filter (CF).

TABLE 1

| | Cathode specular reflection | | Cathode diffuse reflection | |
|---|---|---|---|---|
| Viewing angle | Color coordinates (x, y) | Chromatic aberration | Color coordinates (x, y) | Chromatic aberration |
| 15° | (0.208, 0.550) | 0.250 | (0.208, 0.108) | 0.236 |
| 30° | (0.311, 0.321) | 0.0002 | (0.311, 0.321) | 0.0002 |
| 45° | (0.166, 0.131) | 0.239 | (0.230, 0.254) | 0.105 |

TABLE 2

| | Cathode specular reflection | | Cathode diffuse reflection | |
|---|---|---|---|---|
| Viewing angle | Color coordinates (x, y) | Chromatic aberration | Color coordinates (x, y) | Chromatic aberration |
| 15° | (0.124, 0.701) | 0.423 | (0.155, 0.145) | 0.235 |
| 30° | (0.311, 0.321) | 0.0002 | (0.311, 0.321) | 0.0002 |
| 45° | (0.452, 0.254) | 0.156 | (0.188, 0.149) | 0.211 |

The preparation process of the display substrate in an embodiment of the present disclosure may be realized by using an existing mature preparation device, has small improvements to the existing process, can improve dark color separation without adding procedures or steps, can be well compatible with the existing preparation process, is simple in process implementation, is easy to practice, and has high production efficiency, low production cost and high yield.

In an exemplary implementation, the display substrate of the present disclosure may be applied to a display apparatus with a pixel drive circuit, such as an OLED, a quantum dot display (QLED), a light emitting diode display (Micro LED or Mini LED) or a quantum dot light emitting diode display (QDLED), etc., which is not limited here in the present disclosure.

An exemplary embodiment of the present disclosure further provides a method for preparing a display substrate which may include multiple sub-pixels. The method may include steps of:

forming at least one insulating film layer on a base substrate, providing a concave-convex structure on a side of the at least one insulating film layer away from the base substrate; and forming a first electrode on the side of the at least one insulating film layer away from the base substrate, with an overlapping area between an orthographic projection of the concave-convex structure on the base substrate and an orthographic projection of the first electrode on the base substrate.

An embodiment of the present disclosure further provides a display apparatus which includes the display substrate in a preceding embodiment. The display apparatus may be any product or component with a display function, such as a mobile phone, a tablet computer, a television, a display, a laptop computer, a digital photo frame, and a navigator.

Although the implementations disclosed in the present disclosure are described as above, the described contents are only implementations which are used for facilitating the understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should still be subject to the scope defined by the appended claims.

The invention claimed is:

1. A display substrate, comprising: a base substrate, at least one insulating film layer disposed on the base substrate, and first electrodes disposed on a side of the at least one insulating film layer away from the base substrate;

wherein the at least one insulating film layer comprises a planarization layer, the planarization layer comprises a concave-convex structure disposed on a side of the planarization layer away from the base substrate, the concave-convex structure comprises a plurality of convex portions, and a concave portion is formed between two adjacent convex portions, a segment difference between a highest point of the adjacent convex portions and a lowest point of the concave portion is between ⅛ and ⅞ of a thickness of the planarization layer, and the segment difference between the highest point of the adjacent convex portions and the lowest point of the concave portion is between 0.2 microns and 0.8 microns;

wherein there is an overlapping area between an orthographic projection of the concave-convex structure on the base substrate and an orthographic projection of the first electrodes on the base substrate.

2. The display substrate according to claim 1, comprising: the planarization layer, a light emitting structure layer, an encapsulation layer and a color filter layer that are sequentially formed on the base substrate, wherein the light emitting structure layer comprises a pixel definition layer, an anode, a cathode, and an organic light emitting layer between the anode and the cathode, the pixel definition layer comprises a plurality of pixel openings which expose at least part of the anode; the cathode covers the pixel definition layer;

the color filter layer comprises a black matrix and a color filter disposed at intervals, the black matrix has a plurality of opening areas arranged in a matrix, the color filter is at least partially filled in an opening area, the color filter and the black matrix at least have a partially overlapping area where the color filter covers the black matrix.

3. The display substrate according to claim 2, wherein the at least one insulating film layer comprises the pixel definition layer, and the first electrodes comprise the cathode.

4. The display substrate according to claim 3, wherein the pixel definition layer comprises a plurality of first convex portions, and a first concave portion is formed between adjacent first convex portions.

5. The display substrate according to claim 4, wherein the first concave portion is a groove surrounding a pixel opening, and a distance between adjacent grooves is between ⅛ and ⅞ of a distance between an edge of the opening area of the black matrix and an edge of the pixel opening formed in the pixel definition layer.

6. The display substrate according to claim 5, wherein the distance between adjacent grooves is between 1 micron and 2 microns.

7. The display substrate according to claim 6, further comprising a touch structure layer disposed between the encapsulation layer and the color filter layer, the touch structure layer comprises a plurality of touch electrodes, and an orthographic projection of the black matrix on the base substrate comprises an orthographic projection of the touch electrodes on the base substrate.

8. The display substrate according to claim 5, wherein a width of the groove is between 0.8 microns and 1.5 microns.

9. The display substrate according to claim 4, wherein the first concave portion is an aperture surrounding a pixel opening, and a width of the aperture is between 0.5 microns and 1.8 microns.

10. The display substrate according to claim 9, wherein a plurality of apertures form a plurality of annular structure units, at least one annular structure unit comprises N annular structures disposed around the pixel opening and parallel to each other, and an innermost annular structure comprises a plurality of first apertures, the first apertures are adjacent to the pixel opening, and N is a natural number greater than 1.

11. The display substrate according to claim 10, wherein serrated protrusions are formed between the plurality of first apertures, and a width of a serrated protrusion is between 0.8 microns and 1.5 microns.

12. The display substrate according to claim 11, wherein N is a natural number between 1 and 50.

13. The display substrate according to claim 2, wherein the first electrodes comprise the anode.

14. The display substrate according to claim 2, wherein the at least one insulating film layer further comprises the pixel definition layer, and the first electrodes comprise the cathode and the anode;

a first concave-convex structure is disposed on a side of the pixel definition layer away from the base substrate, and there is an overlapping area between an orthographic projection of the first concave-convex structure on the base substrate and an orthographic projection of the cathode on the base substrate; and there is an overlapping area between an orthographic projection of the concave-convex structure on the base substrate and an orthographic projection of the anode on the base substrate.

15. A display apparatus, comprising the display substrate according to claim 1.

16. A method for preparing a display substrate, comprising:

forming at least one insulating film layer on a base substrate, wherein the at least one insulating film layer comprises a planarization layer, the planarization layer comprises a concave-convex structure disposed on a side of the planarization layer away from the base substrate, the concave-convex structure comprises a plurality of convex portions, and a concave portion is formed between two adjacent convex portions, a segment difference between a highest point of the adjacent convex portions and a lowest point of the concave portion is between ⅛ and ⅞ of a thickness of the planarization layer, and the segment difference between the highest point of the adjacent convex portions and the lowest point of the concave portion is between 0.2 microns and 0.8 microns; and forming a first electrode on the side of the at least one insulating film layer away from the base substrate, with an overlapping area between an orthographic projection of the concave-convex structure on the base substrate and an orthographic projection of the first electrode on the base substrate.

17. A display substrate, comprising: a base substrate, at least one insulating film layer disposed on the base substrate, and first electrodes disposed on a side of the at least one insulating film layer away from the base substrate;

wherein a concave-convex structure is disposed on a side of the at least one insulating film layer away from the base substrate, and there is an overlapping area between an orthographic projection of the concave-convex structure on the base substrate and an orthographic projection of the first electrodes on the base substrate, wherein the at least one insulating film layer comprises a planarization layer and a pixel definition layer disposed on a side of the planarization layer away from the base substrate, the concave-convex structure comprises a first concave-convex structure and a second concave-convex structure, the first concave-convex structure is disposed on a side of the pixel definition layer away from the base substrate, the second concave-convex structure is disposed on a side of the planarization layer away from the base substrate, the second concave-convex structure comprises a plurality of convex portions, and a concave portion is formed between two adjacent convex portions, a segment difference between a highest point of the adjacent convex portions and a lowest point of the concave portion is between ⅛ and ⅞ of a thickness of the planarization layer, and the segment difference between the highest point of the adjacent convex portions and the lowest point of the concave portion is between 0.2 microns and 0.8 microns, and an orthographic projection of the first concave-convex structure on the base substrate is not overlapped with an orthographic projection of the second concave-convex structure on the base substrate.

* * * * *